United States Patent
Jones et al.

(10) Patent No.: US 12,218,202 B2
(45) Date of Patent: Feb. 4, 2025

(54) SEMICONDUCTOR DEVICE INCORPORATING A SUBSTRATE RECESS

(71) Applicant: Wolfspeed, Inc., Durham, NC (US)

(72) Inventors: Evan Jones, Durham, NC (US); Saptha Sriram, Cary, NC (US); Kyle Bothe, Cary, NC (US)

(73) Assignee: Wolfspeed, Inc., Durham, NC (US)

( * ) Notice: Subject to any disclaimer, the term of this patent is extended or adjusted under 35 U.S.C. 154(b) by 167 days.

(21) Appl. No.: 17/477,004

(22) Filed: Sep. 16, 2021

(65) Prior Publication Data

US 2023/0078017 A1 Mar. 16, 2023

(51) Int. Cl.
*H01L 29/778* (2006.01)
*H01L 29/10* (2006.01)

(52) U.S. Cl.
CPC ........ H01L 29/1075 (2013.01); H01L 29/778 (2013.01); H01L 29/7786 (2013.01)

(58) Field of Classification Search
CPC ......... H01L 29/66431; H01L 29/66462; H01L 29/7786; H01L 29/778; H01L 29/2003; H01L 29/7787; H01L 29/267; H01L 29/7789; H01L 29/7783; H01L 29/7816; H01L 29/7826; H01L 29/7823
See application file for complete search history.

(56) References Cited

U.S. PATENT DOCUMENTS

| | | | |
|---|---|---|---|
| 4,680,600 A * | 7/1987 | Tahara | H03K 19/00307 257/474 |
| 4,946,547 A | 8/1990 | Palmour et al. | |
| 5,192,987 A | 3/1993 | Khan et al. | |
| 5,200,022 A | 4/1993 | Kong et al. | |
| 5,210,051 A * | 5/1993 | Carter, Jr. | H01L 33/0008 257/E33.072 |
| 5,296,395 A | 3/1994 | Khan et al. | |
| RE34,861 E | 2/1995 | Davis et al. | |
| 5,389,571 A * | 2/1995 | Takeuchi | H01L 33/007 438/933 |
| 5,393,993 A | 2/1995 | Edmond et al. | |
| 5,523,589 A | 6/1996 | Edmond et al. | |
| 5,739,554 A * | 4/1998 | Edmond | H01L 33/007 257/E33.049 |
| 6,316,793 B1 | 11/2001 | Sheppard et al. | |
| 6,500,257 B1 * | 12/2002 | Wang | H01L 21/0254 438/479 |
| 6,548,333 B2 | 4/2003 | Smith | |
| 6,582,986 B2 * | 6/2003 | Kong | H01L 21/0254 257/E21.112 |
| 7,030,428 B2 | 4/2006 | Saxler | |
| 7,045,404 B2 | 5/2006 | Sheppard et al. | |

(Continued)

OTHER PUBLICATIONS

"International Search Report and Written Opinion for International Application No. PCTUS22/036,623 dated Dec. 16, 2022, 18 pages".

*Primary Examiner* — Sophia T Nguyen

(74) *Attorney, Agent, or Firm* — Myers Bigel, P.A.

(57) ABSTRACT

A semiconductor device includes a substrate having an upper surface including a recess region, a semiconductor structure on the substrate, a portion of the semiconductor structure within the recess region, and a gate contact, a drain contact, and a source contact on the semiconductor structure. The recess region does not vertically overlap the drain contact or the source contact.

13 Claims, 25 Drawing Sheets

(56) References Cited

U.S. PATENT DOCUMENTS

| | | | |
|---|---|---|---|
| 7,052,942 B1* | 5/2006 | Smart | H01L 29/66462 |
| | | | 257/E29.253 |
| 7,084,441 B2* | 8/2006 | Saxler | H01L 29/1029 |
| | | | 257/E29.05 |
| 7,250,641 B2* | 7/2007 | Saito | H01L 29/404 |
| | | | 257/E27.012 |
| 7,259,402 B2 | 8/2007 | Edmond et al. | |
| 7,271,429 B2* | 9/2007 | Saito | H01L 29/7786 |
| | | | 257/E29.252 |
| 7,291,529 B2 | 11/2007 | Slater et al. | |
| 7,498,618 B2* | 3/2009 | Saito | H01L 29/7787 |
| | | | 257/E29.252 |
| 7,544,963 B2 | 6/2009 | Saxler | |
| 7,548,112 B2 | 6/2009 | Sheppard | |
| 7,592,211 B2 | 9/2009 | Sheppard et al. | |
| 7,615,774 B2 | 11/2009 | Saxler | |
| 7,646,043 B2* | 1/2010 | Sriram | H01L 29/808 |
| | | | 257/280 |
| 7,704,860 B2* | 4/2010 | Shimamoto | H01L 21/0254 |
| | | | 438/481 |
| 7,709,269 B2 | 5/2010 | Smith et al. | |
| 7,723,751 B2* | 5/2010 | Kawasaki | H01L 29/66462 |
| | | | 257/330 |
| 7,932,111 B2 | 4/2011 | Edmond | |
| 8,044,433 B2* | 10/2011 | Kawasaki | H01L 29/7787 |
| | | | 257/283 |
| 8,120,064 B2 | 2/2012 | Parikh et al. | |
| 8,183,572 B2* | 5/2012 | Kikkawa | H01L 29/1029 |
| | | | 257/77 |
| 8,212,289 B2* | 7/2012 | Smith | H01L 29/7787 |
| | | | 257/192 |
| 8,390,030 B2* | 3/2013 | Saito | H01L 29/778 |
| | | | 257/195 |
| 8,513,686 B2 | 8/2013 | Edmond | |
| 8,519,439 B2* | 8/2013 | Saito | H01L 29/66462 |
| | | | 257/192 |
| 8,563,372 B2 | 10/2013 | Hagleitner et al. | |
| 8,569,769 B2* | 10/2013 | Hwang | H01L 29/66462 |
| | | | 438/168 |
| 8,603,871 B2* | 12/2013 | Kikkawa | H01L 29/0649 |
| | | | 257/E21.403 |
| 8,759,879 B1* | 6/2014 | Tipirneni | H01L 29/41766 |
| | | | 257/190 |
| 8,772,832 B2* | 7/2014 | Boutros | H01L 29/7783 |
| | | | 257/E29.252 |
| 8,878,246 B2* | 11/2014 | Hwang | H01L 29/267 |
| | | | 257/E29.246 |
| 8,963,207 B2* | 2/2015 | Kawai | H01L 29/66431 |
| | | | 257/192 |
| 9,024,356 B2* | 5/2015 | Curatola | H01L 29/66462 |
| | | | 257/E21.409 |
| 9,048,303 B1* | 6/2015 | Ostermaier | H01L 29/0657 |
| 9,171,836 B2* | 10/2015 | Lal | H01L 27/0629 |
| 9,214,352 B2 | 12/2015 | Hagleitner et al. | |
| 9,231,105 B2* | 1/2016 | Kume | H01L 29/2003 |
| 9,252,247 B2* | 2/2016 | Micovic | H01L 29/42376 |
| 9,281,387 B2* | 3/2016 | Briere | H01L 29/7786 |
| 9,443,968 B2* | 9/2016 | Hwang | H01L 29/205 |
| 9,461,135 B2* | 10/2016 | Kanamura | H01L 29/66462 |
| 9,502,549 B2* | 11/2016 | Ikoshi | H01L 29/66462 |
| 9,515,146 B2* | 12/2016 | Hikosaka | H01L 21/0243 |
| 9,590,060 B2* | 3/2017 | Lal | H01L 27/0629 |
| 9,773,884 B2* | 9/2017 | Chu | H01L 29/0649 |
| 10,002,956 B1* | 6/2018 | Lin | H01L 29/7786 |
| 10,026,834 B2* | 7/2018 | Cheng | H01L 29/4236 |
| 10,079,297 B2* | 9/2018 | Endoh | H01L 29/66462 |
| 10,170,611 B1* | 1/2019 | Tang | H01L 29/7783 |
| 10,211,305 B2* | 2/2019 | Baines | H01L 29/1033 |
| 10,573,734 B1* | 2/2020 | Chou | H01L 29/66462 |
| 10,615,273 B2 | 4/2020 | Liu et al. | |
| 10,658,471 B2* | 5/2020 | Dasgupta | H01L 27/1207 |
| 10,840,334 B2* | 11/2020 | Sriram | H01L 29/7787 |
| 10,868,162 B1* | 12/2020 | Wong | H01L 29/6653 |
| 10,892,356 B2* | 1/2021 | Sriram | H01L 29/7783 |
| 10,971,615 B2* | 4/2021 | Tao | H01L 29/7786 |
| 11,222,969 B2* | 1/2022 | Iucolano | H01L 29/1045 |
| 11,349,012 B2* | 5/2022 | Ostermaier | H01L 29/7786 |
| 11,929,428 B2* | 3/2024 | Smith, Jr. | H01L 29/7786 |
| 2001/0015437 A1* | 8/2001 | Ishii | H01L 21/02576 |
| | | | 257/E21.1 |
| 2001/0040246 A1* | 11/2001 | Ishii | H01L 29/66522 |
| | | | 257/E21.441 |
| 2002/0017648 A1* | 2/2002 | Kasahara | H01L 21/28575 |
| | | | 257/E29.127 |
| 2002/0127856 A1* | 9/2002 | Kunisato | H01L 21/02378 |
| | | | 438/689 |
| 2003/0006409 A1* | 1/2003 | Ohba | H01L 21/02502 |
| | | | 257/E21.127 |
| 2004/0099888 A1* | 5/2004 | Sriram | H01L 29/66856 |
| | | | 257/E29.104 |
| 2004/0157355 A1* | 8/2004 | Kachi | H01L 29/7786 |
| | | | 257/E29.252 |
| 2005/0189559 A1* | 9/2005 | Saito | H01L 29/432 |
| | | | 257/E29.252 |
| 2005/0258450 A1* | 11/2005 | Saxler | H01L 29/0649 |
| | | | 257/E29.05 |
| 2005/0263778 A1* | 12/2005 | Hata | H01L 21/02381 |
| | | | 257/E21.119 |
| 2006/0017064 A1* | 1/2006 | Saxler | H01L 29/66462 |
| | | | 257/E29.253 |
| 2006/0043501 A1* | 3/2006 | Saito | H01L 29/0692 |
| | | | 257/E29.252 |
| 2006/0060871 A1* | 3/2006 | Beach | H01L 29/66462 |
| | | | 257/E29.253 |
| 2006/0091430 A1* | 5/2006 | Sriram | H01L 29/66848 |
| | | | 257/280 |
| 2006/0125001 A1* | 6/2006 | Sriram | H01L 29/8128 |
| | | | 257/E29.104 |
| 2006/0219997 A1* | 10/2006 | Kawasaki | H01L 29/66462 |
| | | | 257/E29.05 |
| 2006/0220065 A1* | 10/2006 | Kawasaki | H01L 21/28587 |
| | | | 257/E29.022 |
| 2007/0018199 A1* | 1/2007 | Sheppard | H01L 29/66462 |
| | | | 257/E29.127 |
| 2007/0051977 A1* | 3/2007 | Saito | H01L 29/0649 |
| | | | 257/E29.127 |
| 2007/0066020 A1* | 3/2007 | Beach | H01L 29/7787 |
| | | | 257/E29.127 |
| 2007/0102727 A1* | 5/2007 | Twynam | H01L 29/42316 |
| | | | 257/E29.127 |
| 2007/0200143 A1* | 8/2007 | Saito | H01L 29/7786 |
| | | | 257/E29.252 |
| 2007/0205407 A1* | 9/2007 | Matsuo | H01L 33/007 |
| | | | 257/E29.05 |
| 2007/0249119 A1* | 10/2007 | Saito | H01L 29/2003 |
| | | | 257/192 |
| 2008/0048176 A1* | 2/2008 | Orita | H01L 29/155 |
| | | | 257/E33.068 |
| 2008/0128753 A1* | 6/2008 | Parikh | H01L 29/66462 |
| | | | 257/E29.253 |
| 2008/0169474 A1* | 7/2008 | Sheppard | H03H 3/08 |
| | | | 257/E27.014 |
| 2008/0179694 A1* | 7/2008 | Nakazawa | H01L 29/1066 |
| | | | 257/E21.409 |
| 2008/0277692 A1* | 11/2008 | Saito | H01L 29/778 |
| | | | 257/E29.253 |
| 2009/0026466 A1* | 1/2009 | Kikkawa | H01L 29/66462 |
| | | | 257/77 |
| 2009/0032879 A1* | 2/2009 | Kuraguchi | H01L 29/872 |
| | | | 257/E29.089 |
| 2009/0057684 A1* | 3/2009 | Otake | H01L 29/66462 |
| | | | 257/190 |
| 2009/0072269 A1* | 3/2009 | Suh | H01L 21/8252 |
| | | | 257/136 |
| 2009/0085063 A1* | 4/2009 | Makiyama | H01L 29/7787 |
| | | | 257/E29.081 |
| 2009/0146185 A1* | 6/2009 | Suh | H01L 29/42364 |
| | | | 257/E27.061 |

(56) References Cited

U.S. PATENT DOCUMENTS

| | | | |
|---|---|---|---|
| 2009/0173968 A1* | 7/2009 | Matsunaga | H01L 29/7787 257/E29.091 |
| 2009/0267078 A1* | 10/2009 | Mishra | H01L 29/365 257/E21.403 |
| 2009/0315037 A1* | 12/2009 | Kikkawa | H01L 29/7783 438/192 |
| 2010/0012952 A1* | 1/2010 | Saxler | H01L 29/66462 257/77 |
| 2010/0012977 A1* | 1/2010 | Derluyn | H01L 29/42316 257/E21.403 |
| 2010/0102359 A1* | 4/2010 | Khan | H01L 21/30621 257/E21.403 |
| 2010/0117094 A1* | 5/2010 | Nishikawa | H01L 29/7783 257/E29.091 |
| 2010/0140660 A1* | 6/2010 | Wu | H01L 29/2003 257/E29.338 |
| 2010/0264462 A1* | 10/2010 | Hirler | H01L 29/41766 257/E21.403 |
| 2011/0057257 A1* | 3/2011 | Park | H01L 29/7787 438/270 |
| 2011/0068370 A1* | 3/2011 | Kim | H01L 29/66462 257/E21.403 |
| 2011/0127540 A1* | 6/2011 | Yamada | H01L 29/41725 257/76 |
| 2011/0212582 A1* | 9/2011 | Hong | H01L 29/7786 257/E21.403 |
| 2011/0233521 A1* | 9/2011 | Saxler | H01L 33/24 257/618 |
| 2011/0272741 A1* | 11/2011 | Hwang | H01L 29/66462 257/E29.247 |
| 2011/0272743 A1* | 11/2011 | Hwang | H01L 29/66462 257/E21.403 |
| 2011/0278598 A1* | 11/2011 | Renaud | H01L 21/746 257/77 |
| 2011/0284865 A1* | 11/2011 | Inoue | H01L 29/0843 257/E21.403 |
| 2011/0303952 A1* | 12/2011 | Hwang | H01L 29/1029 257/E21.403 |
| 2012/0043588 A1* | 2/2012 | Iwabuchi | H01L 29/42316 257/E29.246 |
| 2012/0080687 A1* | 4/2012 | Kuraguchi | H01L 29/417 257/E29.089 |
| 2012/0146095 A1* | 6/2012 | Park | H01L 29/66431 257/77 |
| 2012/0187451 A1* | 7/2012 | Saito | H01L 29/0623 257/192 |
| 2012/0187452 A1* | 7/2012 | Saito | H01L 29/66462 257/E29.091 |
| 2012/0208331 A1* | 8/2012 | Kikkawa | H01L 29/1029 257/E21.403 |
| 2012/0211800 A1* | 8/2012 | Boutros | H01L 29/4175 257/E29.317 |
| 2012/0235160 A1* | 9/2012 | Heikman | H01L 29/402 257/E29.246 |
| 2012/0326215 A1* | 12/2012 | Srivastava | H01L 29/0657 257/E29.409 |
| 2013/0020614 A1* | 1/2013 | Lu | H01L 29/7787 257/E21.407 |
| 2013/0043485 A1* | 2/2013 | Ueno | H01L 21/8252 257/E29.091 |
| 2013/0099284 A1* | 4/2013 | Tserng | H01L 29/402 257/E21.403 |
| 2013/0161638 A1* | 6/2013 | Yao | H01L 29/66462 257/E21.403 |
| 2013/0207194 A1* | 8/2013 | Cai | H01L 29/66636 257/E27.06 |
| 2013/0234146 A1* | 9/2013 | Prechtl | H01L 29/0649 257/190 |
| 2013/0248876 A1* | 9/2013 | Yaegashi | H01L 29/0649 438/268 |
| 2013/0307026 A1* | 11/2013 | Hwang | H01L 29/7787 257/194 |
| 2014/0001478 A1* | 1/2014 | Saunier | H01L 29/7786 257/E21.403 |
| 2014/0034962 A1* | 2/2014 | Curatola | H01L 21/0254 257/194 |
| 2014/0042448 A1* | 2/2014 | Ostermaier | H01L 21/76264 257/E21.409 |
| 2014/0077267 A1* | 3/2014 | Heo | H01L 29/66431 257/194 |
| 2014/0091316 A1* | 4/2014 | Kikkawa | H01L 29/66431 438/172 |
| 2014/0097469 A1* | 4/2014 | Hagleitner | H01L 29/66462 257/256 |
| 2014/0103395 A1* | 4/2014 | Saito | H01L 29/1075 257/192 |
| 2014/0103398 A1* | 4/2014 | Curatola | H01L 29/4175 257/E21.403 |
| 2014/0159117 A1* | 6/2014 | Taniguchi | H01L 29/4232 257/194 |
| 2014/0239311 A1* | 8/2014 | Kawai | H01L 29/7789 257/76 |
| 2014/0253241 A1* | 9/2014 | Lee | H01L 29/7787 330/277 |
| 2014/0264361 A1* | 9/2014 | Chu | H01L 21/6835 257/192 |
| 2014/0264369 A1* | 9/2014 | Padmanabhan | H01L 27/1211 438/172 |
| 2014/0264379 A1* | 9/2014 | Kub | H01L 29/7782 257/77 |
| 2014/0264960 A1* | 9/2014 | Ring | H01L 21/56 257/790 |
| 2014/0319532 A1* | 10/2014 | Werner | H01L 29/778 438/191 |
| 2014/0353720 A1* | 12/2014 | Inoue | H01L 29/42376 438/270 |
| 2015/0034972 A1* | 2/2015 | Kuraguchi | H01L 29/7786 257/77 |
| 2015/0035010 A1* | 2/2015 | Takeuchi | H01L 29/66462 257/194 |
| 2015/0060875 A1* | 3/2015 | Kume | H01L 29/66659 257/344 |
| 2015/0060876 A1* | 3/2015 | Xing | H01L 29/7787 257/76 |
| 2015/0179741 A1* | 6/2015 | Umeda | H01L 29/7786 257/389 |
| 2015/0187924 A1* | 7/2015 | Dasgupta | H01L 29/66462 438/172 |
| 2015/0221758 A1* | 8/2015 | Miura | H01L 29/7787 257/76 |
| 2015/0228773 A1* | 8/2015 | Tajiri | H01L 29/7787 257/194 |
| 2015/0263155 A1* | 9/2015 | Fujimoto | H01L 29/7786 257/76 |
| 2016/0005816 A1* | 1/2016 | Kim | H01L 29/205 257/194 |
| 2016/0005823 A1* | 1/2016 | Yao | H01L 29/2003 257/194 |
| 2016/0020314 A1* | 1/2016 | Saito | H01L 29/205 257/76 |
| 2016/0172455 A1* | 6/2016 | Kikkawa | H01L 21/3085 438/172 |
| 2016/0218204 A1* | 7/2016 | Pei | H01L 29/66462 |
| 2016/0233328 A1* | 8/2016 | Cheng | H01L 29/66462 |
| 2016/0300941 A1* | 10/2016 | Cheng | H01L 29/1037 |
| 2017/0018638 A1* | 1/2017 | Teo | H01L 29/205 |
| 2017/0069788 A1* | 3/2017 | Wunderer | H01L 21/02647 |
| 2017/0077283 A1* | 3/2017 | Nakata | H01L 29/7787 |
| 2017/0103898 A1* | 4/2017 | Inoue | H01L 29/42376 |
| 2017/0148906 A1* | 5/2017 | Iucolano | H01L 21/0254 |
| 2017/0162429 A1* | 6/2017 | Lidow | H01L 29/41766 |
| 2017/0170295 A1* | 6/2017 | Yu | H01L 21/32051 |
| 2017/0263742 A1* | 9/2017 | Endoh | H01L 29/66462 |
| 2017/0338810 A1* | 11/2017 | Chen | H01L 29/205 |
| 2017/0373176 A1* | 12/2017 | Sriram | H01L 29/66431 |
| 2017/0373178 A1* | 12/2017 | Sriram | H01L 29/66068 |
| 2018/0090575 A1* | 3/2018 | Makiyama | H01L 29/66462 |
| 2018/0097081 A1* | 4/2018 | Cao | H01L 29/0649 |

(56) References Cited

U.S. PATENT DOCUMENTS

| | | | |
|---|---|---|---|
| 2018/0350921 A1* | 12/2018 | Dasgupta | H01L 21/02516 |
| 2019/0081164 A1* | 3/2019 | Shrivastava | H01L 29/778 |
| 2019/0115459 A1* | 4/2019 | Kim | H01L 29/1004 |
| 2019/0189746 A1* | 6/2019 | Makiyama | H01L 29/0891 |
| 2019/0207003 A1* | 7/2019 | Radosavljevic | H01L 29/0895 |
| 2019/0229187 A1* | 7/2019 | Sriram | H01L 29/205 |
| 2019/0237569 A1* | 8/2019 | Sriram | H01L 29/402 |
| 2019/0280112 A1* | 9/2019 | Shimizu | H01L 29/205 |
| 2020/0027872 A1* | 1/2020 | Boles | H01L 21/02381 |
| 2020/0119178 A1* | 4/2020 | Okita | H01L 29/7788 |
| 2020/0161461 A1* | 5/2020 | Lee | H01L 21/2654 |
| 2020/0219871 A1* | 7/2020 | Moens | H01L 29/402 |
| 2020/0303533 A1* | 9/2020 | Guo | H01L 29/0607 |
| 2020/0312991 A1* | 10/2020 | Then | H01L 29/4236 |
| 2020/0321447 A1* | 10/2020 | Ostermaier | H01L 29/4236 |
| 2020/0328298 A1* | 10/2020 | Yang | H01L 29/41775 |
| 2020/0381554 A1* | 12/2020 | Pu | H01L 29/4236 |
| 2020/0395474 A1* | 12/2020 | Bothe | H01L 21/76897 |
| 2021/0126120 A1* | 4/2021 | Piedra | H01L 29/1608 |
| 2021/0134966 A1* | 5/2021 | Lee | H01L 21/02378 |
| 2021/0167199 A1* | 6/2021 | Sriram | H01L 29/7783 |
| 2021/0343839 A1* | 11/2021 | Hao | H01L 29/432 |
| 2021/0384345 A1* | 12/2021 | Chen | H01L 29/2003 |
| 2022/0093779 A1* | 3/2022 | Fiorenza | H01L 27/0883 |
| 2022/0130985 A1* | 4/2022 | Bothe | H01L 29/402 |
| 2022/0208980 A1* | 6/2022 | Tsutsumi | H01L 29/7787 |
| 2022/0223724 A1* | 7/2022 | Yang | H01L 29/66462 |
| 2022/0238694 A1* | 7/2022 | Yang | H01L 29/404 |
| 2022/0285542 A1* | 9/2022 | Baringhaus | H01L 29/66462 |
| 2022/0367694 A1* | 11/2022 | Yeh | H01L 29/2003 |
| 2022/0367695 A1* | 11/2022 | Smith, Jr. | H03K 17/08122 |
| 2022/0367696 A1* | 11/2022 | Smith, Jr. | H01L 29/0623 |
| 2022/0367697 A1* | 11/2022 | Hallin | H01L 21/765 |
| 2022/0376098 A1* | 11/2022 | Lee | H01L 29/0603 |
| 2022/0376104 A1* | 11/2022 | Bisges | H01L 21/263 |
| 2023/0011499 A1* | 1/2023 | Morvan | H01L 21/28587 |
| 2023/0078017 A1* | 3/2023 | Jones | H01L 29/66462 257/350 |
| 2023/0122090 A1* | 4/2023 | Fiorenza | H01L 21/02458 257/76 |
| 2023/0197841 A1* | 6/2023 | Sriram | H01L 29/7786 257/76 |
| 2023/0253489 A1* | 8/2023 | Yang | H01L 29/402 257/183 |
| 2024/0213362 A1* | 6/2024 | Piedra | H01L 29/0688 |

\* cited by examiner

SEMICONDUCTOR DEVICE INCORPORATING A SUBSTRATE RECESS

STATEMENT OF U.S. GOVERNMENT INTEREST

This invention was made with Government support under Contract No. N000164-19-C-WP50 awarded by the Office of the Undersecretary of Defense for Research and Engineering (OUSD R&E) Defense Manufacturing Science & Technology (DMS&T). The Government has certain rights in the invention.

FIELD

The present disclosure relates to semiconductor devices, and more particularly, to improved semiconductor structures of semiconductor devices and related fabrication methods.

BACKGROUND

Materials such as silicon (Si) and gallium arsenide (GaAs) have found wide application in semiconductor devices for low power and, in the case of Si, low frequency applications. However, these materials may not be well-suited for high power and/or high frequency applications, for example, due to their relatively small bandgaps (1.12 eV for Si and 1.42 for GaAs at room temperature) and relatively small breakdown voltages.

For high power, high temperature and/or high frequency applications and devices, wide bandgap semiconductor materials may be used, such as silicon carbide (SiC) (e.g., with a bandgap of about 3.2 eV for 4H—SiC at room temperature) and the Group III nitrides (e.g., with a bandgap of about 3.36 eV for gallium nitride (GaN) at room temperature). As used herein, the term "Group III nitride" refers to those semiconducting compounds formed between nitrogen (N) and the elements in Group III of the periodic table, usually aluminum (Al), gallium (Ga), and/or indium (In). The term refers to binary, ternary, and quaternary compounds, such as GaN, AlGaN, and AlInGaN. These compounds have empirical formulas in which one mole of nitrogen is combined with a total of one mole of the Group III elements. These materials may have higher electric field breakdown strengths and higher electron saturation velocities as compared to GaAs and Si.

Semiconductor devices fabricated from SiC and/or Group III nitrides may include power transistor devices, such as field effect transistor (FET) devices including MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally-diffused metal-oxide semiconductor) transistors, etc.

SUMMARY

According to some embodiments of the present invention, a semiconductor device includes a substrate, wherein an upper surface of the substrate comprises a recess region, a semiconductor structure on the substrate, a portion of the semiconductor structure within the recess region, and a gate contact, a drain contact, and a source contact on the semiconductor structure. The recess region does not vertically overlap the drain contact or the source contact.

In some embodiments, the semiconductor structure comprises a high electron mobility transistor (HEMT) or a field effect transistor (FET).

In some embodiments, the FET comprises a metal-oxide semiconductor FET (MOSFET) or a metal-semiconductor FET (MESFET).

In some embodiments, the substrate comprises an impurity region adjacent the recess region.

In some embodiments, the impurity region comprises a p-type impurity.

In some embodiments, the impurity region is on at least one sidewall and/or a bottom surface of the recess region.

In some embodiments, the portion of the semiconductor structure within the recess region is doped with a p-type dopant.

In some embodiments, the recess region is on a portion of the semiconductor structure that extends from below the source contact to below the gate contact.

In some embodiments, the recess region is on a portion of the semiconductor structure that extends from below the drain contact to below the gate contact.

In some embodiments, the gate contact comprises a first gate contact, semiconductor device further comprises a second gate contact, and the recess region is under the first gate contact.

In some embodiments, the first and second gate contact extend in a first direction on the semiconductor structure, and the recess region has a longitudinal axis that extends in the first direction.

In some embodiments, a first threshold voltage of a first transistor associated with the first gate contact is different from a second threshold voltage of a second transistor associated with the second gate contact.

In some embodiments, the gate contact has a longitudinal axis extending in a first direction, and recess region comprises a plurality of recess regions arranged under the gate contact and spaced apart from one another along the first direction.

In some embodiments, the semiconductor structure comprises a Group III nitride.

According to some embodiments of the present invention, a semiconductor device includes a substrate, an impurity region in the substrate, a semiconductor structure on the substrate, and a gate contact, a drain contact, and a source contact on the semiconductor structure. A first thickness of a first portion of the semiconductor structure on the impurity region is greater than a second thickness of a second portion of the semiconductor structure.

In some embodiments, the impurity region is on at least one sidewall and/or a bottom surface of a recess region in the substrate.

In some embodiments, the recess region is on a source access region of the semiconductor structure and/or a drain access region of the semiconductor structure.

In some embodiments, the recess region does not overlap the source contact and/or the drain contact in a direction that is perpendicular to a bottom surface of the substrate.

In some embodiments, the impurity region comprises a p-type impurity.

In some embodiments, the gate contact comprises a first gate contact, the semiconductor device further comprises a second gate contact, and the first portion of the semiconductor structure is between the first gate contact and the substrate.

In some embodiments, a first threshold voltage of a first transistor associated with the first gate contact is different from a second threshold voltage of a second transistor associated with the second gate contact.

In some embodiments, the gate contact has a longitudinal axis extending in a first direction, and the impurity region is on at least one sidewall and/or a bottom surface of respective ones of a plurality of recess regions arranged along the first direction in the substrate under the gate contact.

In some embodiments, the gate contact has a longitudinal axis extending in a first direction, and the impurity region is on at least one sidewall and/or a bottom surface of a continuous trench in the substrate having a longitudinal axis extending in the first direction.

According to some embodiments of the present invention, a semiconductor device includes a substrate, wherein an upper surface of the substrate comprises a recess region, an impurity region in the substrate and on at least one sidewall and/or a bottom surface of the recess region, and a semiconductor structure on the recess region and the impurity region.

In some embodiments, a first thickness of a first portion of the semiconductor structure on the recess region is greater than a second thickness of a second portion of the semiconductor structure that is remote from the recess region.

In some embodiments, the semiconductor device further includes a gate contact, a drain contact, and a source contact on the semiconductor structure. The recess region is on a source access region of the semiconductor structure and/or a drain access region of the semiconductor structure.

In some embodiments, the recess region does not overlap the source contact and/or the drain contact in a direction that is perpendicular to a bottom surface of the substrate.

In some embodiments, the gate contact comprises a first gate contact, the semiconductor device further comprises a second gate contact, and the recess region is between the first gate contact and the substrate.

In some embodiments, a first threshold voltage of a first transistor associated with the first gate contact is different from a second threshold voltage of a second transistor associated with the second gate contact.

In some embodiments, the gate contact has a longitudinal axis extending in a first direction, and the recess region comprises a plurality of recess regions under the gate contact and spaced apart along the first direction.

In some embodiments, the gate contact has a longitudinal axis extending in a first direction, and the recess region comprises a continuous trench in the substrate having a longitudinal axis extending in the first direction.

In some embodiments, the impurity region comprises a p-type impurity.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

DETAILED DESCRIPTION

Embodiments of the present inventive concepts are described more fully hereinafter with reference to the accompanying drawings, in which embodiments of the invention are shown. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

The present disclosure provides semiconductor devices in which an on-resistance of the device is reduced and/or a gate threshold of the device is adjusted. The reduction in resistance and/or adjustment of gate threshold of the device is accomplished, in part, through utilization of a recess region in a substrate of the semiconductor device. A location of the recess region may be modified to provide a variety of beneficial improvements to the device.

In the context of HEMT devices, the present disclosure may arise from recognition of effects of GaN buffer thickness on properties of HEMT devices (e.g., on threshold voltage). The GaN buffer may be monolithically integrated by including a GaN-filled trench and/or recess region in selective regions of the HEMT device. In some embodiments, the GaN-filled trench and/or recess region may placed under the source access region which decreases depletion resulting from the adjacent gate field. A reduction in depletion in this area decreases resistance of the HEMT device. In some embodiments, the use of the GaN-filled trench and/or recess may be combined with a buried P region used in trapping reduction.

Figure 1A:
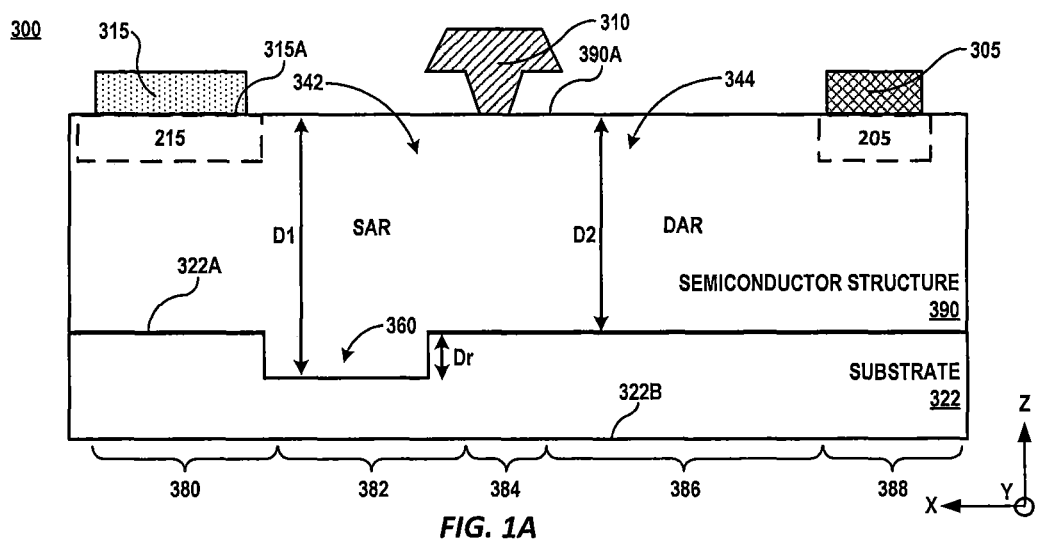
FIGS. 1A to 1C illustrate example embodiments of a semiconductor device according to some embodiments of the present disclosure.
Figure 1B:
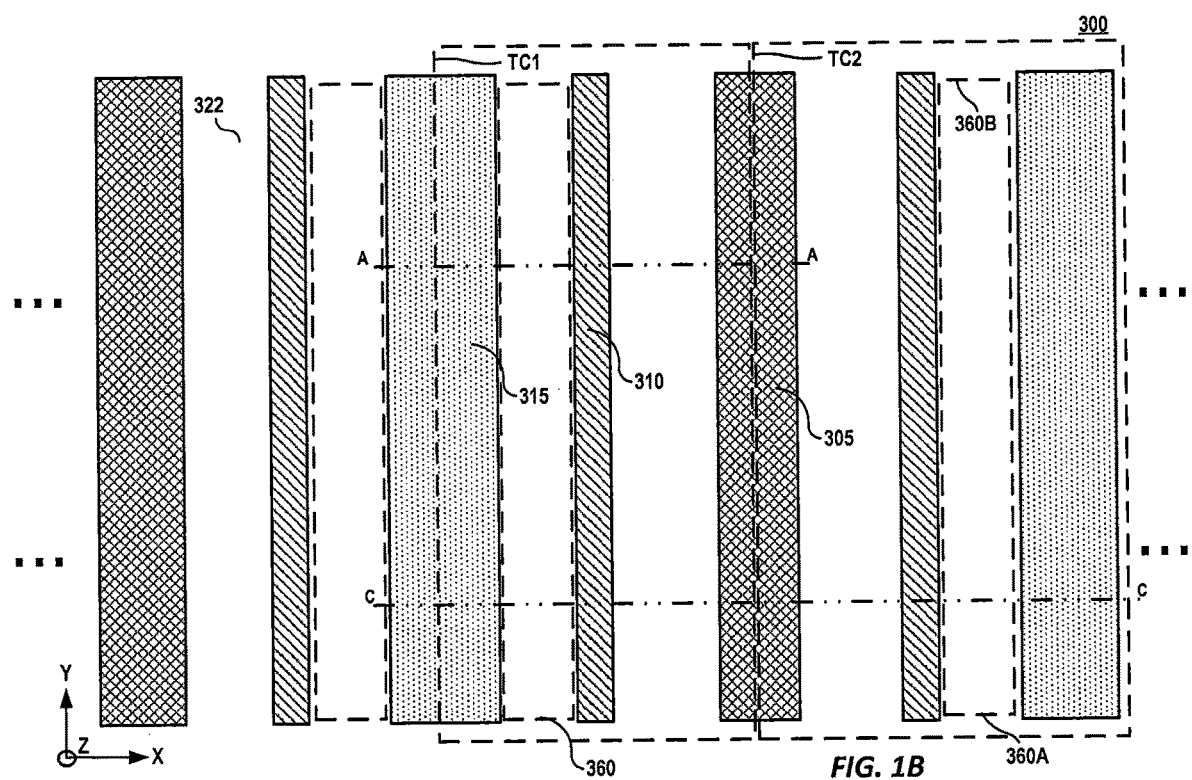
Figure 1C:
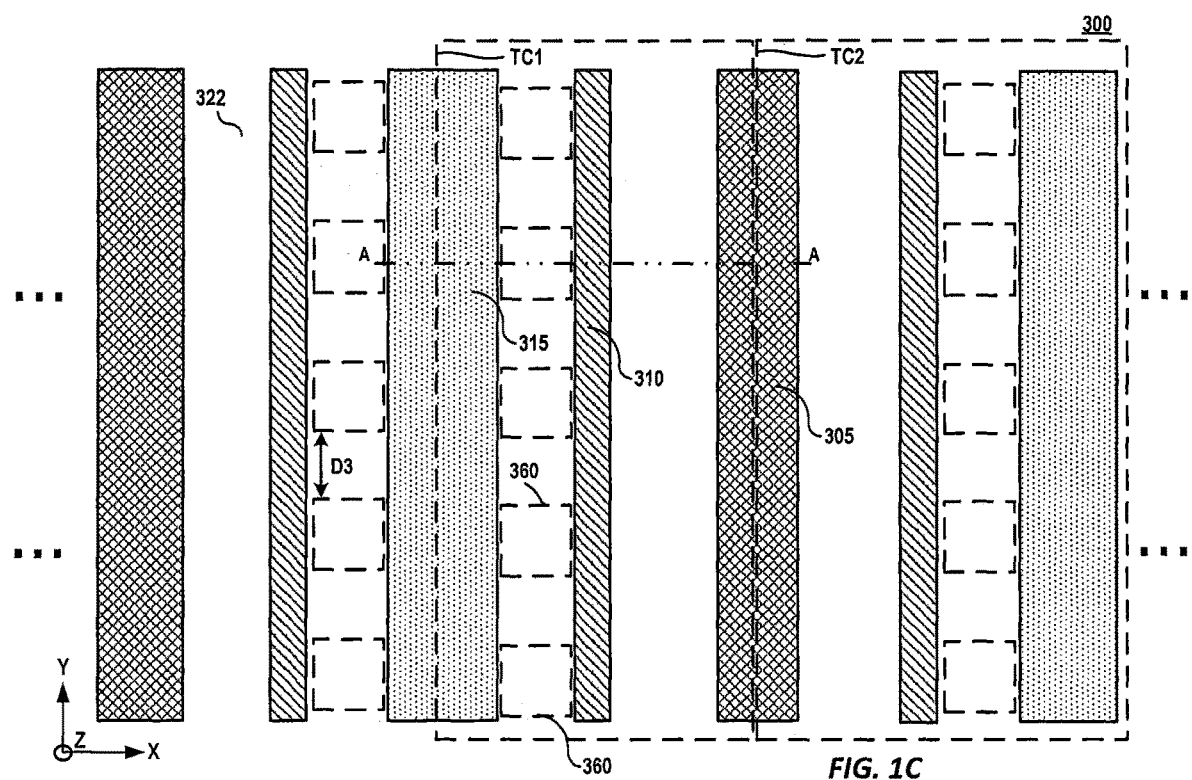

FIGS. 1A to 1C illustrate example embodiments of a semiconductor device 300 according to some embodiments of the present disclosure. FIGS. 1A to 1C are intended to represent structures for identification and description and are not intended to represent the structures to physical scale.

Referring to FIG. 1A, a semiconductor device 300 includes a substrate 322 and a semiconductor structure 390 on the substrate 322. The semiconductor structure 390 of FIG. 1A is a schematic example, shown as a generic semiconductor structure 390 that may incorporate a number of types and/or configurations of semiconductor elements, as will be described further herein.

The semiconductor structure 390 may be provided on a substrate 322, such as a silicon carbide (SiC) substrate or a sapphire substrate. The substrate 322 may be a semi-insulating SiC substrate. However, embodiments of the present disclosure may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like. The substrate 322 may be a SiC wafer, and the semiconductor device 300 may be formed, at least in part, via wafer-level processing, and the wafer may then be diced or otherwise singulated to provide a die including a plurality of the unit cell transistor structures. The term "semi-insulating" is used descriptively herein, rather than in an absolute sense. In some embodiments, the substrate 322 may be doped to have an n-type conductivity.

The semiconductor structure 390 may be a SiC- and/or Group III nitride-based material in some embodiments. A portion of the semiconductor structure 390 may define a channel region of the semiconductor device 300. The channel region may extend between a source region 215 and a drain region 205 of the semiconductor device 300. Conduction in the channel region may be controlled by a signal applied to a gate contact 310. Signals may be applied to the source region 215 via source contact 315 and to drain region 205 via drain contact 305. A portion of the semiconductor structure 390 from below the source contact 315 to below the gate contact 310 may be referred to as the source access region SAR, and a portion of the semiconductor structure 390 from below the drain contact 305 to below the gate contact 310 may be referred to as the drain access region DAR.

Though not illustrated in FIG. 1A, the semiconductor device 300 may include other elements such as insulation layers, passivation layers, metal transmission lines in the like. These elements are not illustrated in FIG. 1A to focus on other portions of the device but, as would be understood by one of ordinary skill in the art, these other elements may be present as needed for the functioning of the semiconductor device 300.

From a general point of view, the semiconductor device 300 will operate on the principle of electrons flowing between the source region 215 and the drain region 205 under control of the gate contact 310. As will be discussed further herein, the configuration of the semiconductor structure 390 may affect the mechanisms by which this operation is established. Respective areas defined by the arrangement of source, drain, and gate of the semiconductor device 300 can impact the resistance of the semiconductor device 300, each illustrated in FIG. 1A. Such areas include a source contact resistance area 380, a source access region resistance area 382, a gate contact resistance area 384, a drain access region resistance area 386, and a drain contact resistance area 388.

The source contact resistance area 380 is a region of the semiconductor structure 390 that is vertically overlapped by the source contact 315. The gate contact resistance area 384 is a region of the semiconductor structure 390 that is vertically overlapped by the gate contact 310. The drain contact resistance area 388 is a region of the semiconductor structure 390 that is vertically overlapped by the drain contact 305. It will be understood that "an element A vertically overlapping an element B" (or similar language) as used herein means that at least one vertical line intersecting both the elements A and B exists. The vertical direction may be a direction that is perpendicular to the bottom surface of the substrate (e.g., the Z direction).

The source access region resistance area 382 extends between the source contact resistance area 380 and the gate contact resistance area 384. The source access region resistance area 382 may vertically overlap the source access region SAR. The drain access region resistance area 386 extends between the drain contact resistance area 388 and the gate contact resistance area 384. The drain access region resistance area 386 may vertically overlap the drain access region DAR. The configuration and/or operation of the semiconductor device 300 may form a first depletion region 342 in the source access region SAR and a second depletion region 344 in the drain access region DAR.

The locations of the source contact resistance area 380, the source access region resistance area 382, the gate contact resistance area 384, the drain access region resistance area 386, and the drain contact resistance area 388 are schematic and not intended to limit the present disclosure.

A recess region 360 may be formed in the substrate 322. The recess region 360 may provide the substrate 322 with a non-linear upper surface 322A. For example, a height of the upper surface of the substrate 322A above a bottom surface of the substrate 322B within the recess region 360 may be less than a height of the upper surface of the substrate 322A above the bottom surface of the substrate 322B outside the recess region 360. In some embodiments, a depth Dr of the recess region 360 may be between 0.05 μm and 0.4 μm. In some embodiments, a width of the trench (e.g., in the X direction in FIG. 1A) may be between 0.5 μm and 7 μm.

As a result of the recess region 360, a first depth D1 of the semiconductor structure 390 (e.g., above the recess region 360) in the source access region SAR may be greater than a second depth D2 of the semiconductor structure 390 in the drain access region DAR. Here, a depth of the semiconductor structure 390 refers to a distance between an upper surface 390A of the semiconductor structure 390 and the upper surface 322A of the substrate 322 in a vertical direction (e.g., a direction that is perpendicular to the bottom surface 322B of the substrate 322, the Z direction in FIG. 1A).

As a result of the increased depth D1, less charge accumulation and a reduced depletion may occur within the first depletion region 342 in comparison to a device that does not include the recess 360. The reduction in the charge accumulation may result in a reduced on-resistance of the semiconductor device 300.

In some embodiments, the recess region 360 may be disposed so as to not overlap with the source contact 315. More specifically, an interface 315A may exist between the source contact 315 and the source region 215. The recess region 360 may be formed so as not to vertically overlap (e.g., overlapping in the Z direction) the interface 315A between the source contact 315 and the source region 215. In some embodiments, increasing a depth/thickness of the semiconductor structure 390 under the source contact interface 315A (e.g., in the source contact resistance area 380) may increase a source resistance of the device. However, the embodiments of the present disclosure are not limited to those embodiments in which the recess region 360 does not overlap the source contact 315. In some embodiments, a portion of the recess region 360 may vertically overlap (e.g., overlapping in the Z direction) the interface 315A between the source contact 315 and the source region 215.

The recess region 360 may be formed to have a longitudinal axis that extends in parallel with a longitudinal axis of the source contact 315 and/or the gate contact 310 (e.g., the Y direction FIG. 1A.) FIG. 1B illustrates a plan view of the semiconductor device 300, according to some embodiments of the present disclosure. FIG. 1A corresponds to a cross-section taken along the line A-A in FIG. 1B.

Referring to FIG. 1B, in some embodiments, the device may include a plurality of source contacts 315, drain contacts 305, and gate contacts 310 on the substrate 322. The plurality of drain contacts 305 and source contacts 315 may be alternately arranged on the substrate 322. A gate contact 310 may be disposed between adjacent drain contacts 305 and source contacts 315 to form a plurality of transistor unit cells, examples of which are designated as TC1 and TC2 in FIG. 1B. Respective ones of the transistor unit cells TC1, TC2 may include a source contact 315, a drain contact 305, and a gate contact 310. FIGS. 1A and 1B illustrate a subset of the source contacts 315, drain contacts 305, and gate contacts 310 for ease of discussion, but it will be understood that the semiconductor device 300 may have additional structures, including additional source contacts 315, drain contacts 305, and gate contacts 310, that are not illustrated in FIGS. 1A and 1B. As will be understood by one of ordinary skill in the art, a transistor may be formed by the active region between the source contact 315 and the drain contact 305 under the control of a gate contact 310 between the source contact 315 and the drain contact 305.

In FIG. 1B, structures such as metal wiring layers, insulating layer, and/or vias for providing additional electrical connections and other structures of the semiconductor device 300 are not illustrated.

As illustrated in FIG. 1B, the recess region 360 may, in some embodiments, extend as a continuous trench having a longitudinal axis in the source access region SAR in parallel with a longitudinal axis of the source contacts 315, drain contacts 305, and/or gate contacts 310 (e.g., the Y direction). The recess region 360 may have opposing endpoints 360A, 360B at opposite ends of the recess region 360. In some embodiments, the endpoints 360A, 360B may be formed so that the recess region 360 extends along a majority e.g., greater than 80%, of the length of the source contact 315. In some embodiments, the length of the recess region 360 (e.g., in the Y direction in FIG. 1B) may be greater than that of the source contact 315. For example, in some embodiments, one or more of the endpoints 360A, 360B may extend beyond opposing ends of the source contact 315.

FIG. 1C illustrates an additional embodiment of the recess region 360. As illustrated in FIG. 1C, a plurality of recess regions 360 may be formed as a plurality of trenches arranged along a direction that is substantially parallel to the source contact 315 (e.g., the Y direction in FIG. 1C). In the source access region SAR, the plurality of recess regions 360 may be spaced apart from each other by a third distance D3. In some embodiments, the third distance D3 may range from 0.5 μm to 7 μm.

Figure 2:
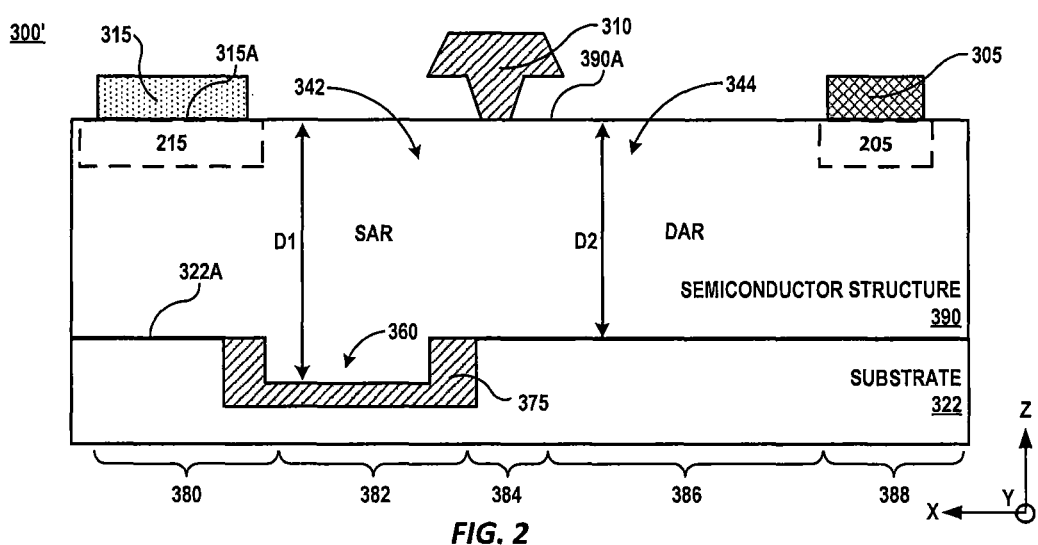
FIG. 2 is a cross-sectional view illustrating an embodiment of a semiconductor device according to some embodiments of the present disclosure.

FIG. 2 is a cross-sectional view illustrating an embodiment of a semiconductor device 300' according to some embodiments of the present disclosure. A discussion of elements of FIG. 2 that are substantially the same as those of FIGS. 1A to 1C will be omitted.

Referring to FIG. 2, in some embodiments, an impurity region 375 may be formed in the substrate 322. In some embodiments, the impurity region 375 may be formed on opposing sidewalls of the trench forming the recess region 360. In some embodiments the impurity region 375 may be formed deeper in the substrate 322 such that the impurity region 375 is located below the recess region 360.

In some embodiments, the impurity region 375 may be formed from a p-type material. For example, the impurity region 375 may be formed by doping (e.g., via ion implantation) of aluminum (Al), boron (B), gallium (Ga), indium (In), and/or thallium (Tl), or any other material that may form a p-type layer. In some embodiments, the p-type conductivity of the impurity region 375 may differ from an n-type conductivity of the substrate 322. In some embodiments, the impurity region 375 may be configured to have a varying doping and/or implantation profile perpendicular to the upper surface 322A of the substrate 322. In some embodiments, the impurity region 375 may not laterally extend across the full active region. For example, the impurity region 375 may not vertically overlap one or more of the drain contact 305, source contact 315, and/or gate contact 310.

In some embodiments, the presence of the impurity region 375 in the substrate 322 may reduce trapping in the semiconductor device 300'. In some embodiments, part of the voltage from the drain region 205 to the source region 215 may be dropped in the impurity region 375. This may also deplete the channel in the lateral direction. The lateral depletion may reduce the lateral field and increase breakdown voltage. In some embodiments, a more compact structure can be obtained for a required breakdown voltage. The impurity region 375 may eliminate the need to have doping (e.g., C or Fe) of the semiconductor structure 390 used to sustain the applied drain voltage. Elimination of deep doping levels may lead to decreased current reduction under operating conditions (e.g., no or reduced trapping). Moreover, in some aspects the impurity region 375 supports the field.

Figure 3:
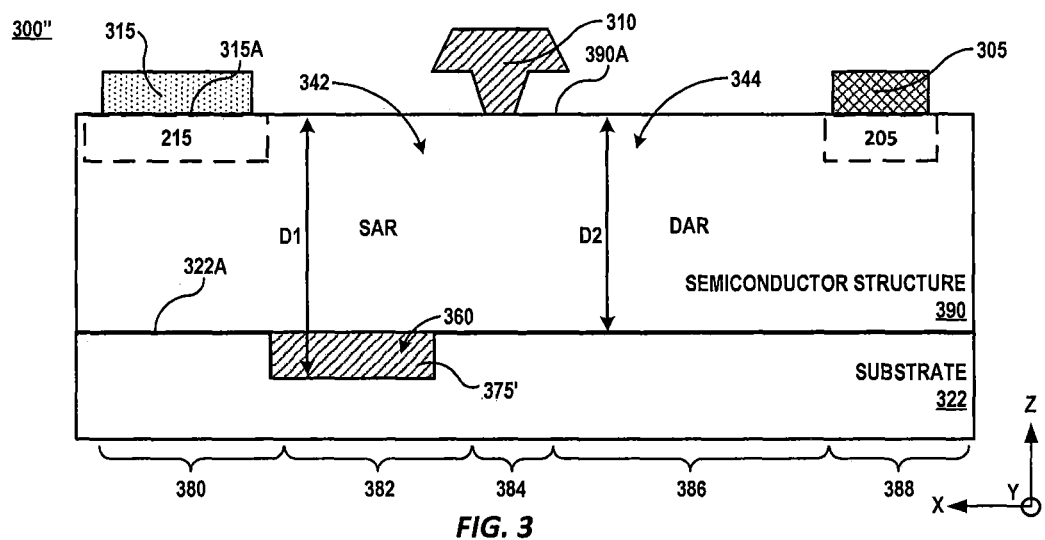
FIG. 3 is a cross-sectional view illustrating an embodiment of a semiconductor device according to some embodiments of the present disclosure.

FIG. 3 is a cross-sectional view illustrating an embodiment of a semiconductor device 300" according to some embodiments of the present disclosure. A discussion of elements of FIG. 3 that are substantially the same as those of FIGS. 1A to 1C will be omitted.

Referring to FIG. 3, in some embodiments, an impurity region 375' may be formed in the semiconductor structure 390 within the recess region 360. In some embodiments, the impurity region 375' may be formed on the bottom surface and/or one or more of the sidewalls of the trench forming the recess region 360. In some embodiments, the impurity region 375' may completely fill the recess region 360, but the present disclosure is not limited thereto. The impurity region 375' may include aluminum (Al), boron (B), gallium (Ga), or any other material that may form a p-type layer. In some embodiments, the impurity region 375' may be configured to have a varying doping and/or implantation profile, either vertically or laterally, within the recess region 360. The use of the p-type layer illustrated in FIG. 3 may provide similar benefits to the semiconductor device 300" as those described herein with respect to FIG. 2. In some embodiments, the impurity conductivity type of the impurity region 375' may be different than portions of the semiconductor structure 390 directly adjacent the impurity region 375'. For example, in some embodiments, the impurity region 375' may be a p-type region and portions of the semiconductor structure 390 directly adjacent the impurity region 375' may be doped to be n-type. In some embodiments, the impurity region 375' and portions of the semiconductor structure 390 directly adjacent the impurity region 375' may have the same conductivity type (e.g., both p-type), but a concentration of the dopants within the impurity region 375' may be higher than that of the portions of the semiconductor structure 390 directly adjacent the impurity region 375'.

Though FIGS. 1A to 1C, 2, and 3 illustrate an embodiment in which the recess region 360 is formed in the source access region resistance area 382, the present disclosure is not limited thereto. FIGS. 4A to 4E are cross-sectional views of example embodiments that incorporate a recess region 360' in the drain access region resistance area 386 (see FIG. 1A). A discussion of elements of FIG. 4A to 4E that are substantially the same as those of the previously-discussed figures will be omitted.

Figure 4A:
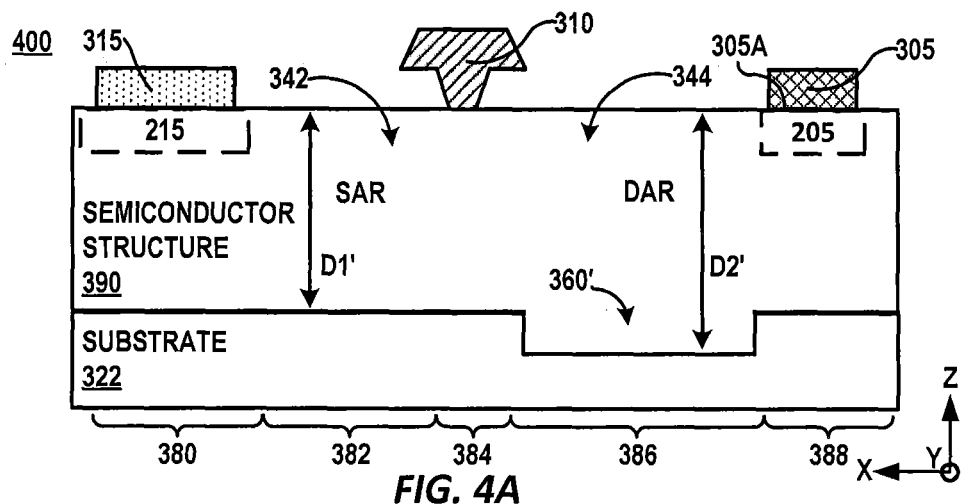
FIGS. 4A to 4E illustrate example embodiments of a semiconductor device according to some embodiments of the present disclosure.

Referring to FIG. 4A, a semiconductor device 400 may include a recess region 360' placed in the drain access region resistance area 386 so as to vertically overlap at least a portion of the drain access region DAR. As a result of the recess region 360', the second depth D2' of the semiconductor structure 390 (e.g., above the recess region 360') in the drain access region DAR may be greater than a first depth D1' of the semiconductor structure 390 in the source access region SAR. The dimensions (e.g., a length or depth) of the recess region 360' may be similar to those discussed herein in FIG. 1A with respect to the recess region 360.

As with the semiconductor device 300 described in FIG. 1A, the difference in thickness of the semiconductor structure 390 as a result of the recess region 360' may impact the charge accumulation of the device. For example, as a result of the recess region 360', the depletion in the second depletion region 344 may be lower than that of the first depletion region 342, and a resistance of the semiconductor device 300' may be decreased.

As illustrated in FIG. 4A, an interface 305A may exist between the drain contact 305 and the drain region 205. In some embodiments, the recess region 360' may be disposed so as not to vertically overlap (e.g., in the Z direction) the interface 305A between the drain contact 305 and the drain region 205. However, the embodiments of the present disclosure are not limited to those embodiments in which the recess region 360' does not overlap the drain contact 305. In some embodiments, a portion of the recess region 360' may vertically overlap (e.g., overlapping in the Z direction) the interface 305A between the drain contact 305 and the drain region 205.

Figure 4B:
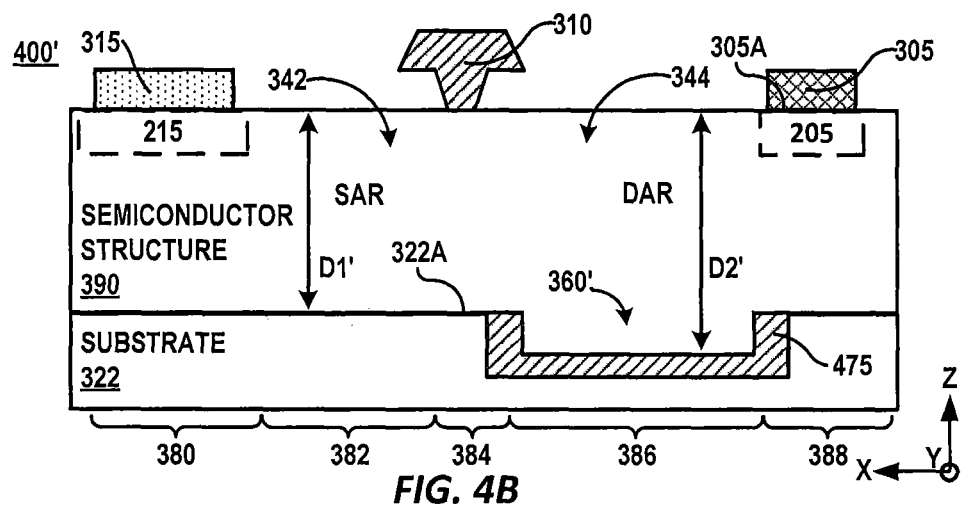

FIG. 4B illustrates a semiconductor device 400' in which an impurity region 475 is formed in the substrate 322. In some embodiments, the impurity region 475 may be formed on one or more of the sidewalls of the trench forming the recess region 360'. In some embodiments, the impurity region 475 may be formed deeper in the substrate 322 such that the impurity region 475 is located below the recess region 360'.

In some embodiments, the impurity region 475 may be formed from a p-type material. For example, the impurity region 475 may be formed by doping (e.g., by ion implantation) of aluminum (Al), boron (B), gallium (Ga), or any other material that may form a p-type layer. In some embodiments, the impurity region 475 may be configured to have a varying doping and/or implantation profile perpendicular to the upper surface 322A of the substrate 322. In some embodiments, the impurity region 475 may not laterally extend across the full active region. For example, the impurity region 475 may not vertically overlap one or more of the drain contact 305, source contact 315, and/or gate contact 310.

Figure 4C:
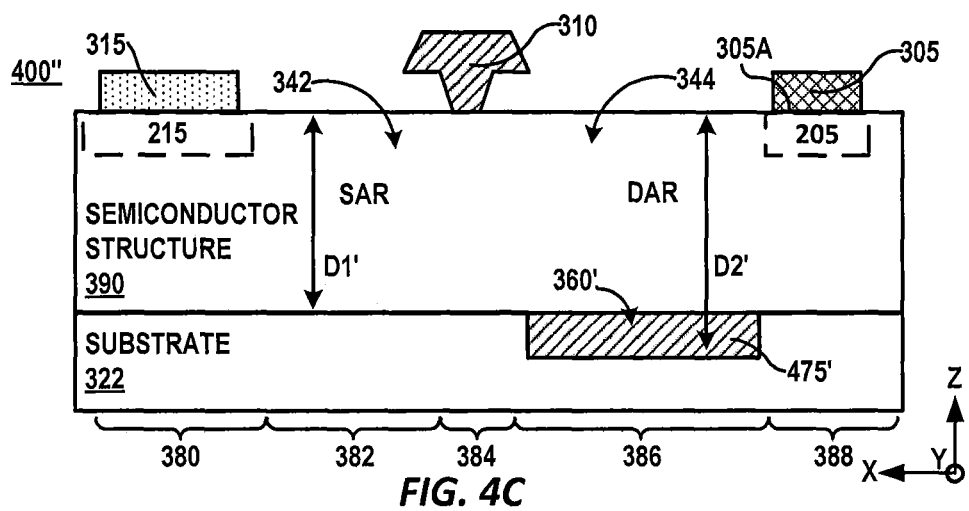

FIG. 4C is a cross-sectional view illustrating a semiconductor device 400" according to some embodiments of the present disclosure. Referring to FIG. 4C, in some embodiments, an impurity region 475' may be formed in the semiconductor structure 390 within the recess region 360'. In some embodiments, the impurity region 475' may be formed on a bottom surface and/or one or more of the sidewalls of the trench forming the recess region 360'. In some embodiments, the impurity region 475' may completely fill the recess region 360', but the present disclosure is not limited thereto. The impurity region 475' may include aluminum (Al), boron (B), gallium (Ga), or any other material that may form a p-type layer. In some embodiments, the impurity region 475' may be configured to have a varying doping and/or implantation profile, either vertically or laterally, within the recess region 360'.

Figure 4D:
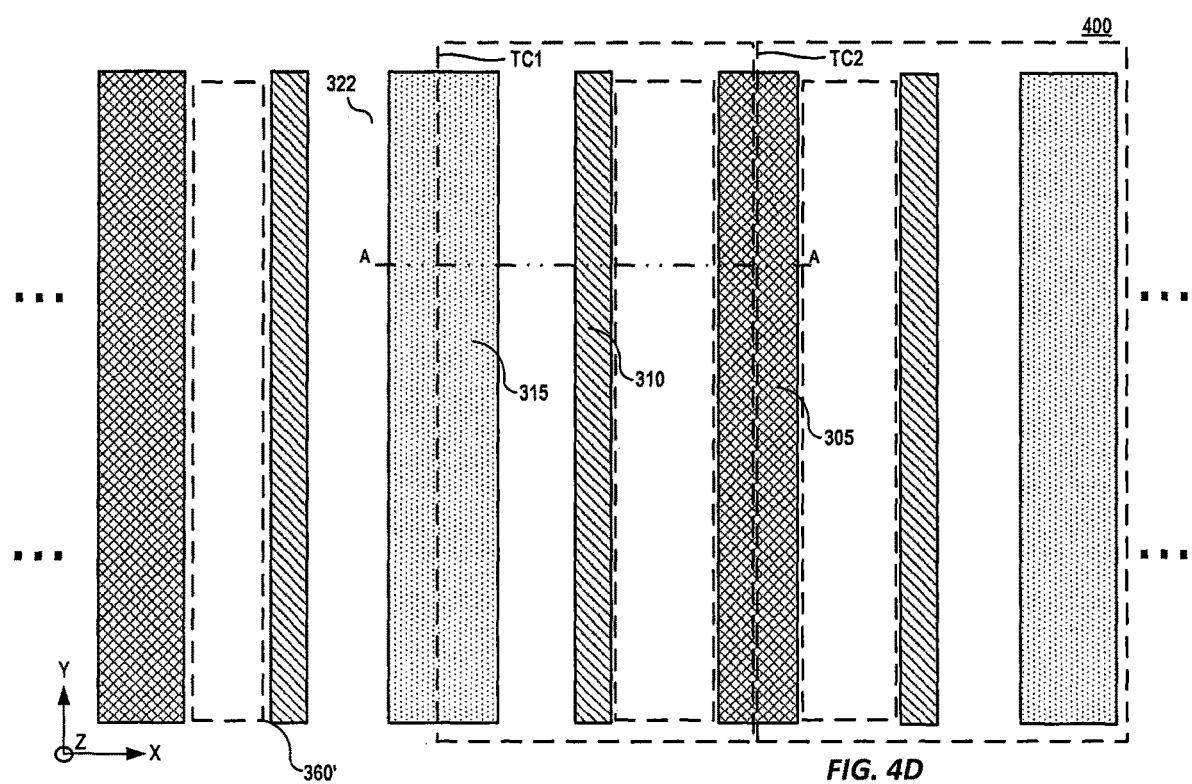
Figure 4E:
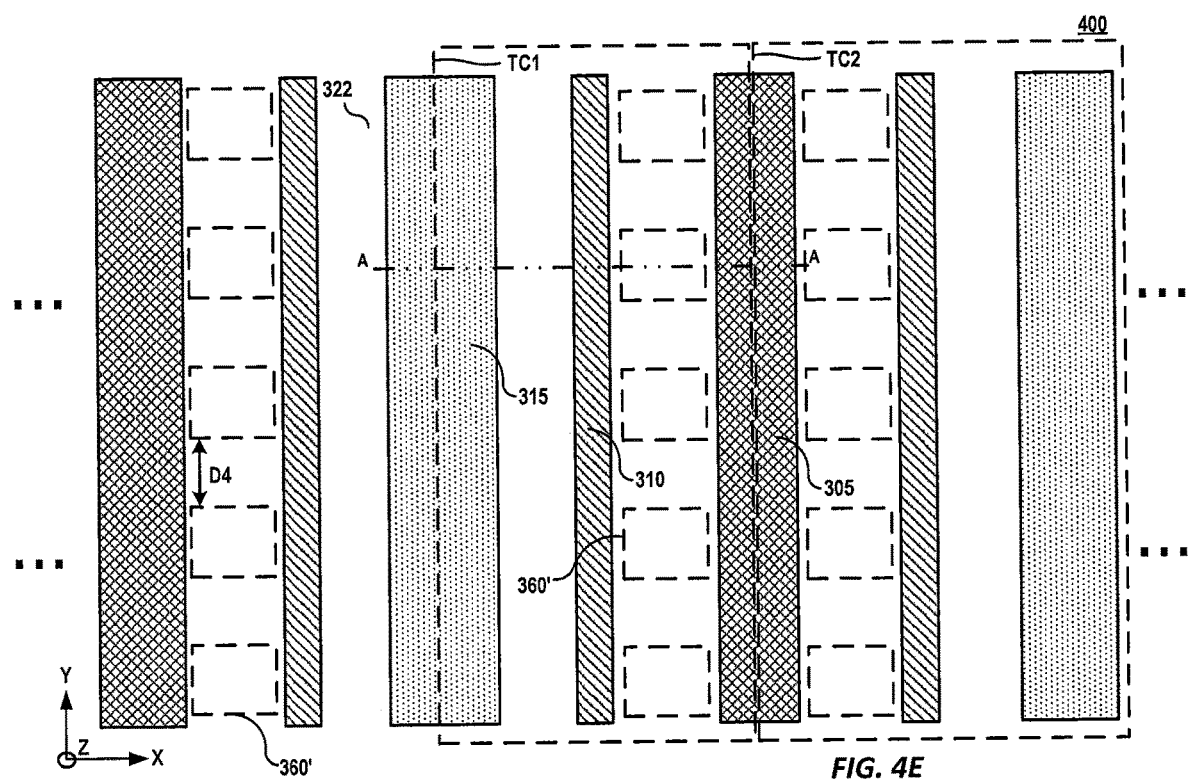

FIGS. 4D and 4E are plan views illustrating example embodiments of the recess region 360'. FIGS. 4A to 4C correspond to a cross-section taken along the line A-A in FIGS. 4D and 4E.

Referring to FIG. 4D, the recess region 360' may, in some embodiments, extend as a continuous trench having a longitudinal axis in the drain access region in parallel with a longitudinal axis of the source contacts 315, drain contacts 305, and/or gate contacts 310 (e.g., the Y direction). The recess region 360' may extend along a majority, e.g., greater than 80%, of the length of the drain contact 305. In some embodiments, the length of the recess region 360' (e.g., in the y-direction in FIG. 4D) may be greater than that of the drain contact 305. For example, in some embodiments, one or more of the endpoints of the recess region 360' may extend beyond opposing ends of the drain contact 305.

FIG. 4E illustrates an additional embodiment in which a plurality of recess regions 360' may be formed as a plurality of trenches arranged along a direction that is substantially parallel to the drain contact 305 (e.g., the Y direction in FIG. 4E). In the drain access region DAR, the plurality of recess regions 360' may be spaced apart from each other by a fourth distance D4. In some embodiments, the fourth distance D4 may range from 0.5 μm to 7 μm.

FIGS. 5A to 5E are cross-sectional views of example embodiments that incorporate a recess region 360" in the gate contact resistance area 384 (see FIG. 1A). A discussion of elements of FIG. 5A to 5E that are substantially the same as those previously-discussed will be omitted.

Figure 5A:
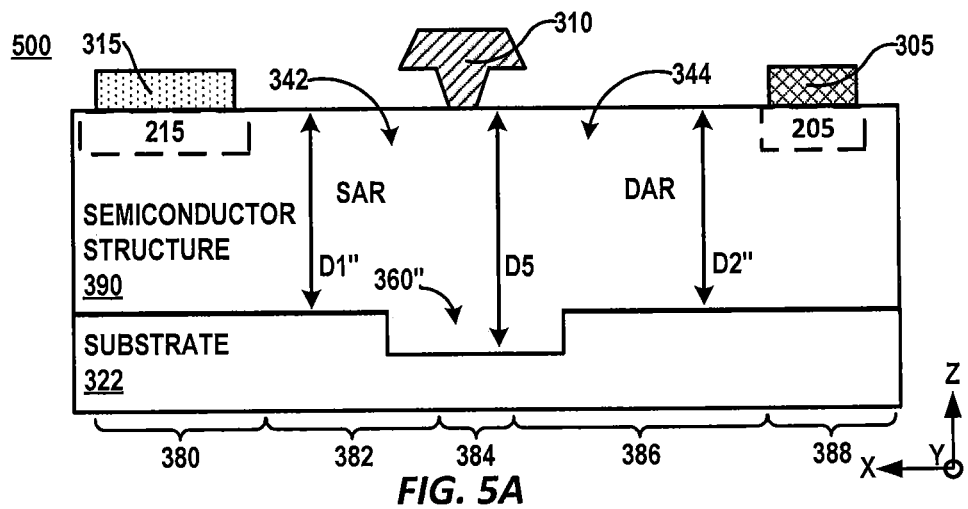
FIGS. 5A to 5E illustrate example embodiments of a semiconductor device according to some embodiments of the present disclosure.

Referring to FIG. 5A, a semiconductor device 500 includes a recess region 360" that is placed in the gate contact resistance area 384 so as to vertically overlap at least a portion of the gate contact 310. As a result of the recess region 360", a fifth depth D5 of the semiconductor structure 390 (e.g., above the recess region 360') under the gate contact 310 may be greater than both a first depth D1" of the semiconductor structure 390 in the source access region SAR a second depth D2" of the semiconductor structure 390 in the drain access region DAR.

The difference in thickness of the semiconductor structure 390 as a result of the recess region 360" may alter the threshold voltage of the semiconductor device 300". For example, by varying a depth and/or width of the recess region 360", the threshold voltage of the semiconductor device 300" may be altered from that of a similarly-constructed semiconductor device not having such a recess region 360". While the present disclosure is not bound to a particular theory of operation, the altered threshold voltage may be due to an altered charge accumulation in the device and may be a result of an altered carrier concentration in the thicker region. For example, a more concentrated carrier distribution may result in the recess region 360". In some embodiments, the presence of the recess region 360" may increase the threshold voltage of the resulting semiconductor device 500 as compared to the threshold voltage of a transistor device without such a recess region 360".

Figure 5B:
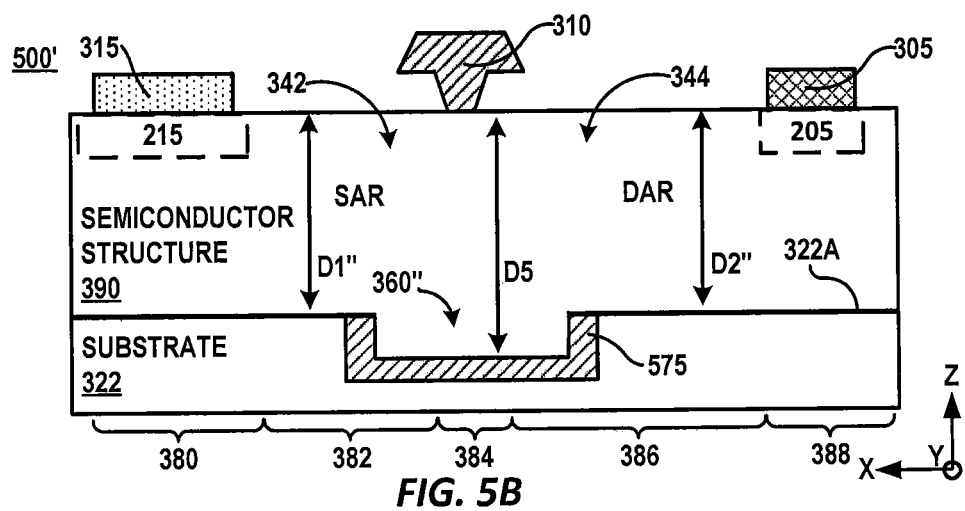

FIG. 5B illustrates a semiconductor device 500' in which an impurity region 575 is formed in the substrate 322. In some embodiments, the impurity region 575 may be formed on one or more of the sidewalls of the trench forming the recess region 360". In some embodiments, the impurity region 575 may be formed deeper in the substrate 322 such that the impurity region 575 is located below the recess region 360".

In some embodiments, the impurity region 575 may be formed from a p-type material. For example, the impurity region 575 may be formed by doping (e.g., by ion implantation) of aluminum (Al), boron (B), gallium (Ga), or any other material that may form a p-type layer. In some embodiments, the impurity region 575 may be configured to have a varying doping and/or implantation profile perpendicular to the upper surface 322A of the substrate 322. In some embodiments, the impurity region 575 may not laterally extend across the full active region. For example, the impurity region 575 may not vertically overlap one or more of the drain contact 305, source contact 315, and/or gate contact 310.

Figure 5C:
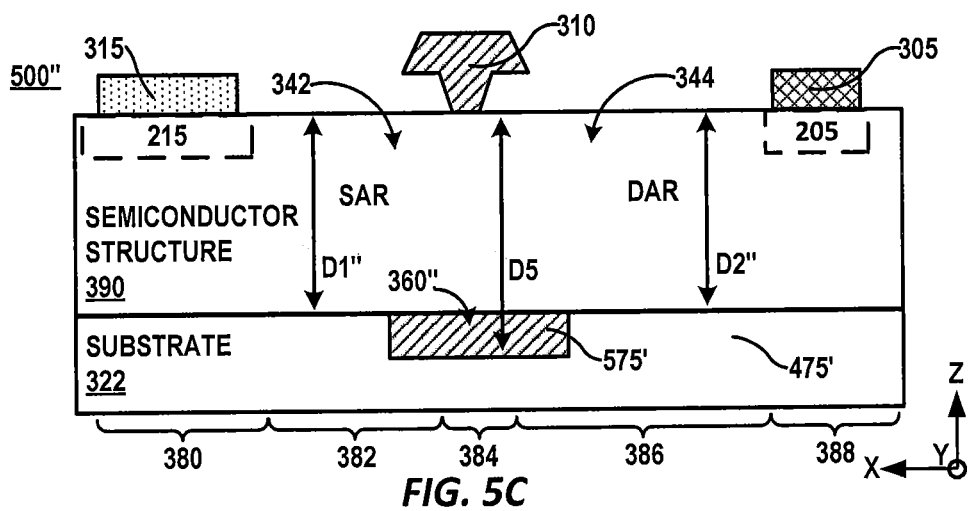

FIG. 5C is a cross-sectional view illustrating a semiconductor device 500" according to some embodiments of the present disclosure. Referring to FIG. 5C, in some embodiments, an impurity region 575' may be formed in the semiconductor structure 390 within the recess region 360". In some embodiments, the impurity region 575' may be formed on a bottom surface and/or one or more of the sidewalls of the trench forming the recess region 360". In some embodiments, the impurity region 475' may completely fill the recess region 360", but the present disclosure is not limited thereto. The impurity region 575' may include aluminum (Al), boron (B), gallium (Ga), or any other material that may form a p-type layer. In some embodiments, the impurity region 575' may be configured to have a varying doping and/or implantation profile, either vertically or laterally, within the recess region 360".

Figure 5D:
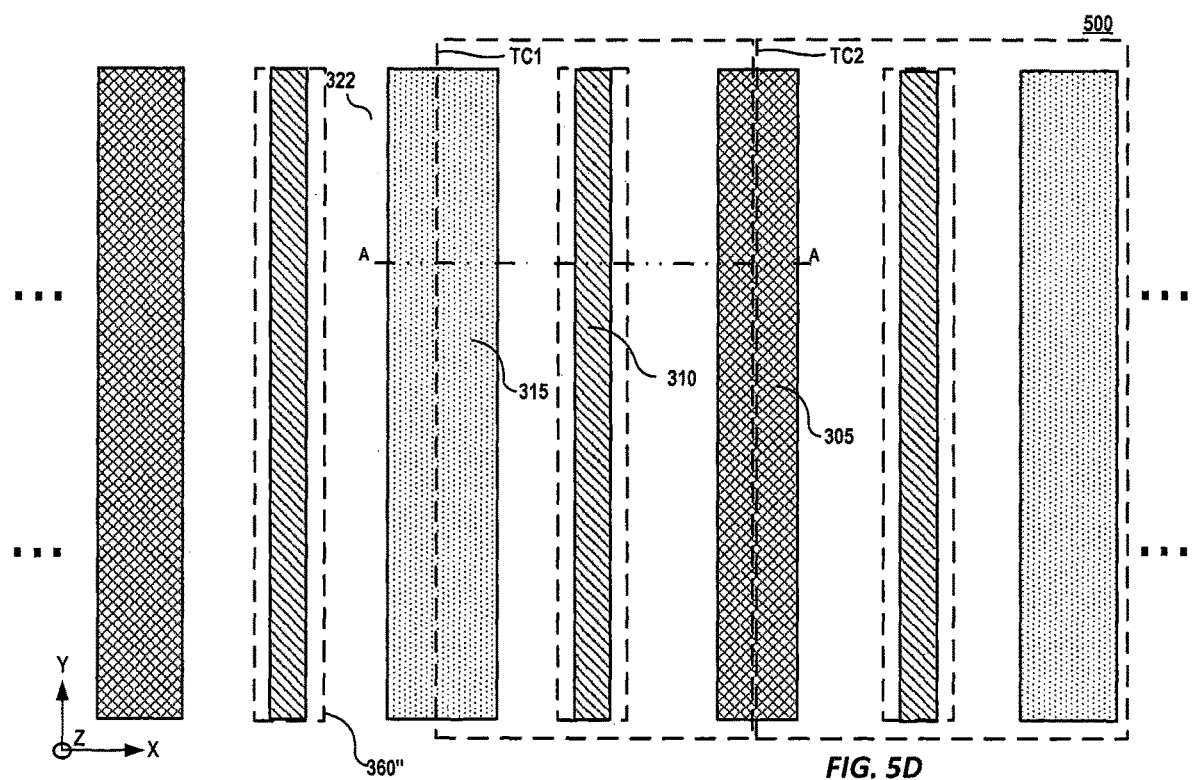
Figure 5E:
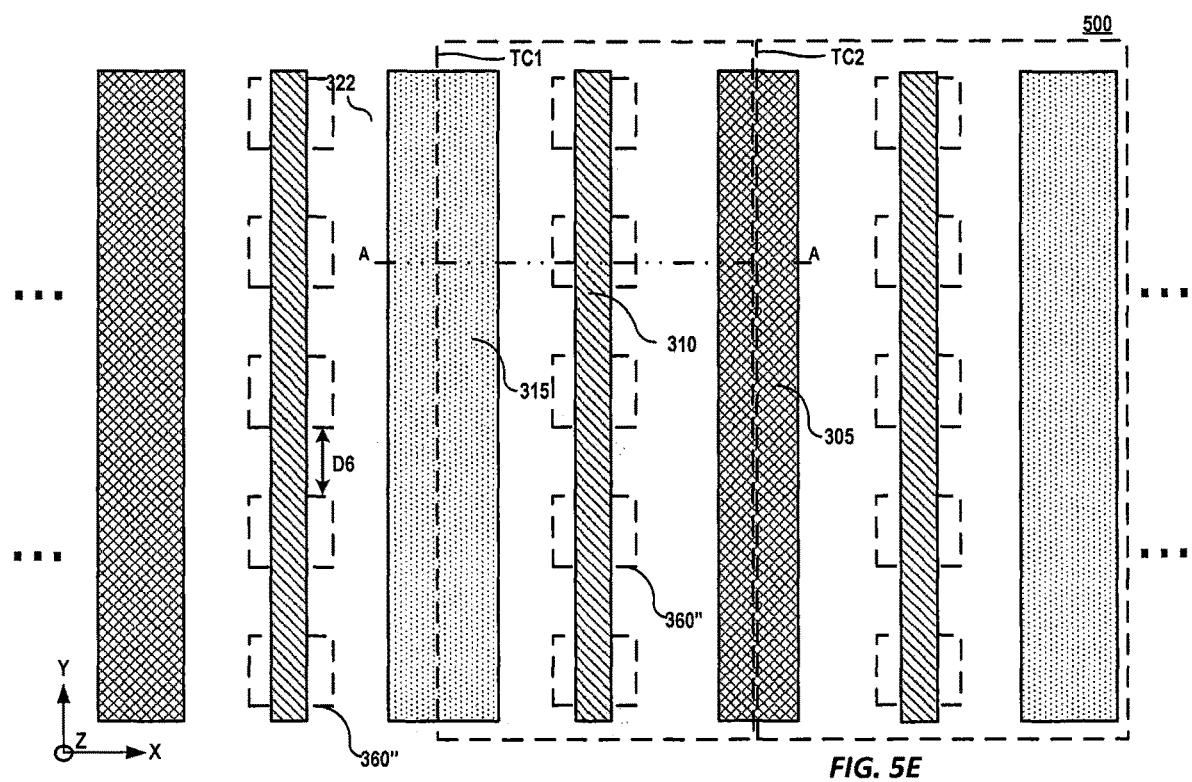

FIGS. 5D and 5E are plan views illustrating example embodiments of the recess region 360". FIGS. 5A to 5C correspond to a cross-section taken along the line A-A in FIGS. 5D and 5E.

Referring to FIG. 5D, the recess region 360" may, in some embodiments, extend as a continuous trench under, and in parallel with, a longitudinal axis of the gate contact 310 (e.g., the Y direction in FIG. 5D). The recess region 360" may extend along a majority (e.g., greater than 80%) of the length of the gate contact 310. In some embodiments, the length of the recess region 360" (e.g., in the Y direction) may be greater than that of the gate contact 310. For example, in some embodiments, one or more of the endpoints of the recess region 360" may extend beyond opposing ends of the gate contact 310.

FIG. 5E illustrates an additional embodiment in which a plurality of recess regions 360" may be formed as a plurality of trenches arranged along a direction that is substantially parallel to the gate contact 310 (e.g., the Y direction in FIG. 5E). The plurality of recess regions 360" may be spaced apart from each other by a sixth distance D6. In some embodiments, the sixth distance D6 may range from 0.5 μm to 7 μm.

In some embodiments, the recess regions 360" beneath the gate contact 310 may be provided in some unit transistor cells, but not in all unit transistor cells, of a semiconductor device. As previously described, the presence of the recess region 360" beneath the gate contact 310 may increase the voltage threshold of the device. Providing some unit cell transistors having a first threshold voltage and some unit cell transistors having a second threshold voltage, different from the first threshold voltage, may allow for the construction of different types of semiconductor behavior. For example, by designing the semiconductor devices to have different threshold voltages in different regions of the device, different portions of the channel of the semiconductor device (e.g., a 2DEG channel in a HEMT device) may turn on at different degrees or levels in response to application of a gate voltage. In other words, channels of different unit cells of the semiconductor device may turn on at different levels of current flow. In some embodiments, semiconductor devices formed in wide band-gap semiconductor material systems such as, for example, gallium nitride-based semiconductors, may exhibit fast turn-on behavior where all of the unit cells turn on essentially simultaneously. Since the third order transconductance tends to peak at turn-on, multi-cell semiconductor devices formed in such material systems may experience a large spike in the third order transconductance at device turn-on, since the unit cells turn on simultaneously. By varying the threshold voltage so that different portions of the device have different threshold voltages, the degree to which the channel is turned on at any given time will vary across the device. This may result, for example, in a reduction of the magnitude of the spike in the third order transconductance. Techniques for varying the threshold voltage within a semiconductor device are discussed, for example, in commonly-owned U.S. Pat. No. 10,615,273, filed on Jun. 21, 2021, the entire contents of which are incorporated herein by reference.

Figure 6A:
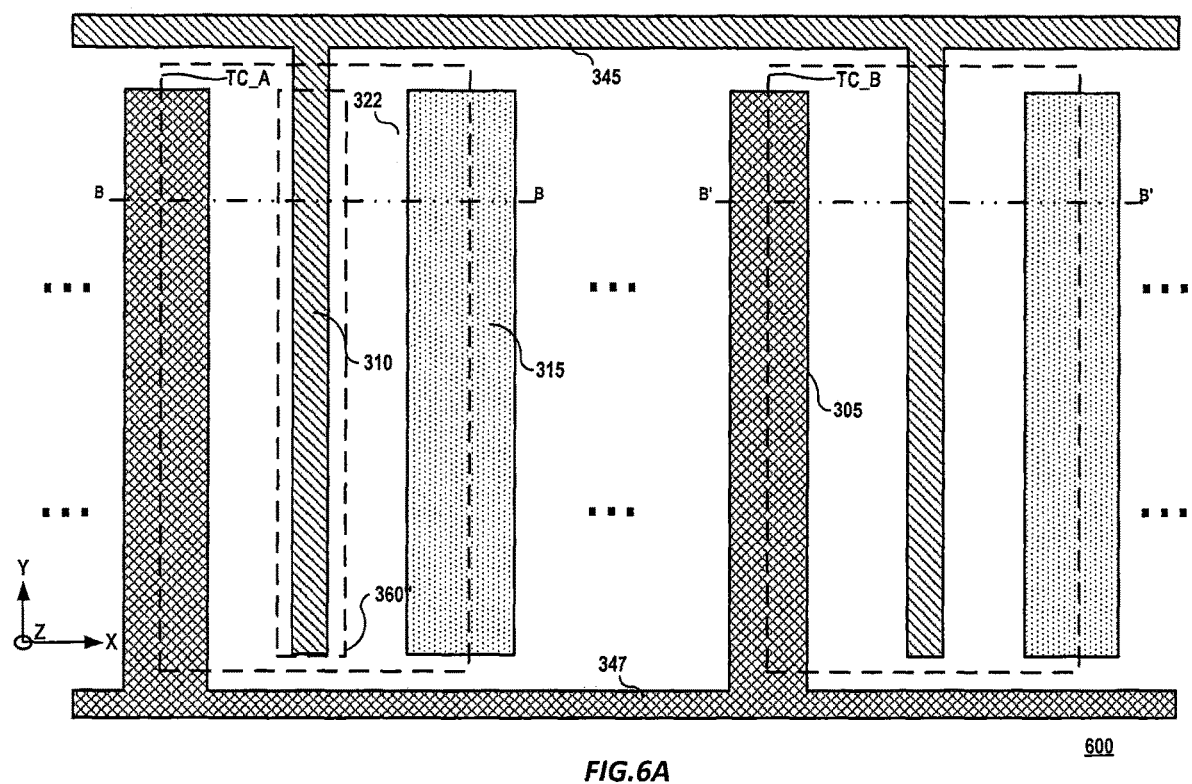
FIGS. 6A to 6C illustrate embodiments utilizing variations of the recess regions according to some embodiments of the present disclosure.
Figure 6B:
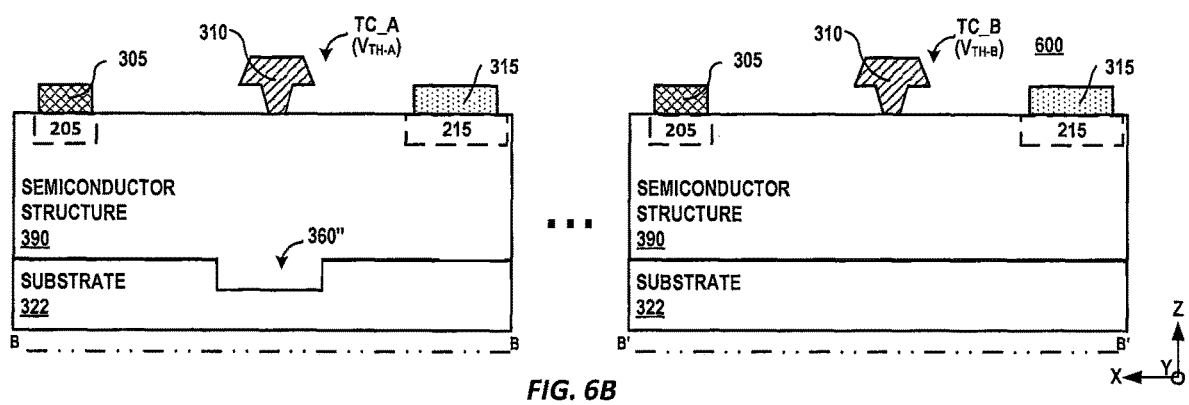
Figure 6C:
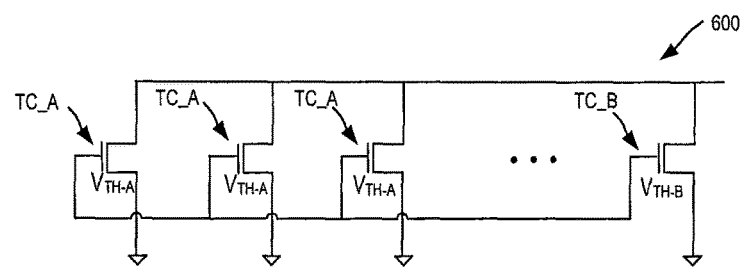

FIGS. 6A to 6C illustrate embodiments utilizing variations of the recess regions 360", according to some embodiments of the present disclosure. FIG. 6A is a plan view of a semiconductor device 600 according to some embodiments of the present disclosure, while FIG. 6B is a cross-sectional view of the semiconductor device 600 of FIG. 6A taken along the lines B-B and B'-B'. FIG. 6C is a schematic circuit view of the semiconductor device 600 of FIG. 6A. A description of elements of FIGS. 6A to 6C that have been previously described will be omitted.

Referring to FIG. 6A, a plan view of a semiconductor device 600 is illustrated that is similar to that of FIG. 5D. Namely a plurality of gate contacts 310, source contacts 315, and drain contacts 305 may be arranged on a semiconductor structure 390 that is further disposed on a substrate 322. The semiconductor device 600 may include a plurality of unit cell transistors TC_A, TC_B electrically connected in parallel. In some embodiments, the parallel connection may be accomplished by a gate bus 345 that is connected to each of the gate contacts 310 and a drain bus 347 that is connected to each of the drain contacts 305. Each of the gate contacts 310 may be a portion of a unit cell transistor TC_A, TC_B. In FIGS. 6A-6C only a subset of unit cell transistors is illustrated, but it will be understood that additional unit cell transistors may be present.

Referring to FIGS. 6A and 6B, a first unit cell transistor TC_A may incorporate a gate contact 310 having a recess region 360" in the substrate 322 beneath the gate contact 310. The presence of the recess region 360" may result in the first unit cell transistor TC_A having a first voltage threshold $V_{TH\text{-}A}$.

A second unit cell transistor TC_B of the semiconductor device 600 may incorporate a gate contact 310, but may not have a recess region beneath the gate contact 310. As a result, the second unit cell transistor TC_B will have a second voltage threshold $V_{TH\text{-}B}$ that is different from the first voltage threshold $V_{TH\text{-}A}$.

In FIG. 6A, the number of first unit cell transistors TC_A and second unit cell transistors TC_B is merely an example, and the embodiments of the present disclosure are not limited thereto. The configuration of the first and second unit cell transistors TC_A, TC_B may result in a parallel connection of the unit cell transistors having different voltage thresholds, as illustrated in FIG. 6C. As a result of the parallel connection of the various unit cell transistors, different portions of the device may turn-on at different applied gate voltages, providing improved linearity.

Though FIG. 6A illustrates an embodiment in which the recess region 360" is incorporated as a continuous trench, the embodiments of the present invention are not limited thereto. In some embodiments, the recess region 360" may be provided as a series of separated trenches, in a manner similar to FIG. 5E.

The preceding figures have illustrated embodiments in which a recess region 360, 360', 360" is provided in the source access region, the drain access region, or under the gate contact, but the embodiments of the present disclosure are not limited thereto. In some embodiments, two or more of the previously illustrated recess regions 360, 360', 360" may be combined. For example, a semiconductor device may include a recess region 360 under the source access region as well as a recess region 360' under the drain access region, or other combinations of the recess regions 360, 360', 360" described herein.

The preceding figures have illustrated variations on the use of a recess region 360, 360', 360" in a substrate 322 that is incorporated as part of a semiconductor structure 390. As would be understood by one of ordinary skill in the art, the recess region 360, 360', 360" may be applied to a number of different semiconductor structures without deviating from the embodiments of the present disclosure.

Figure 7A:
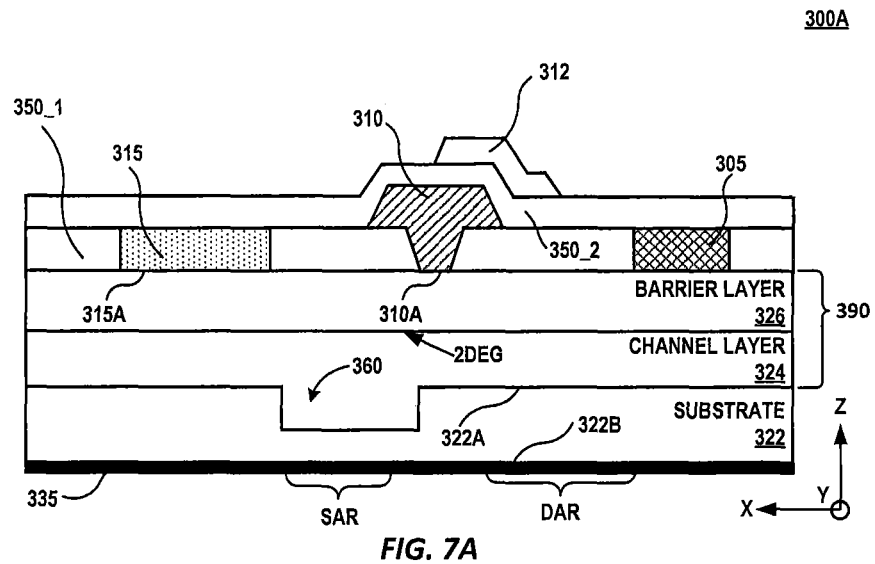
FIGS. 7A to 7C are cross-sectional views of example embodiments of a semiconductor device according to some embodiments of the present disclosure.
Figure 7B:
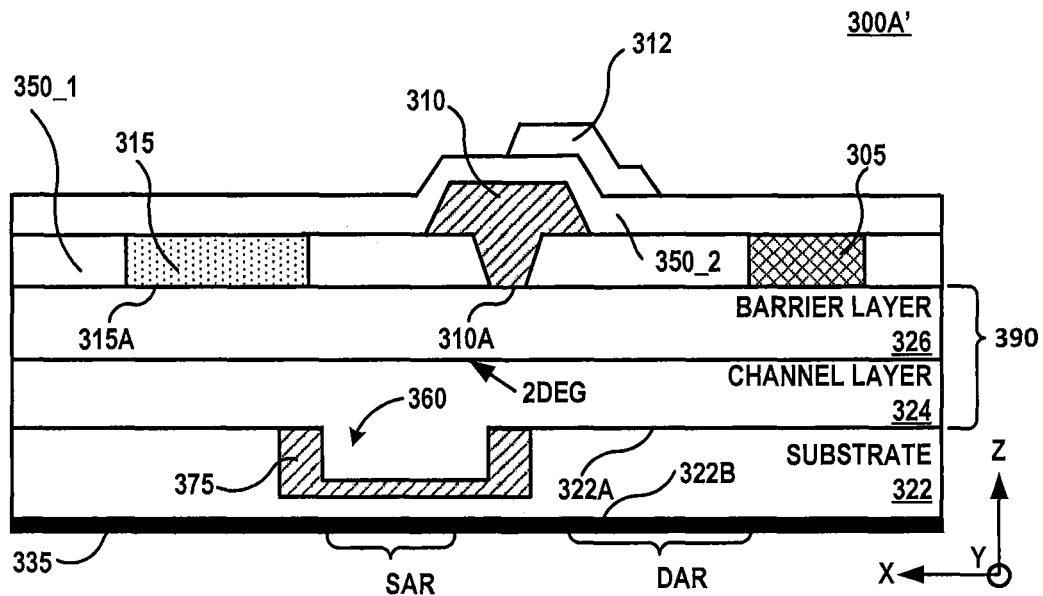
Figure 7C:
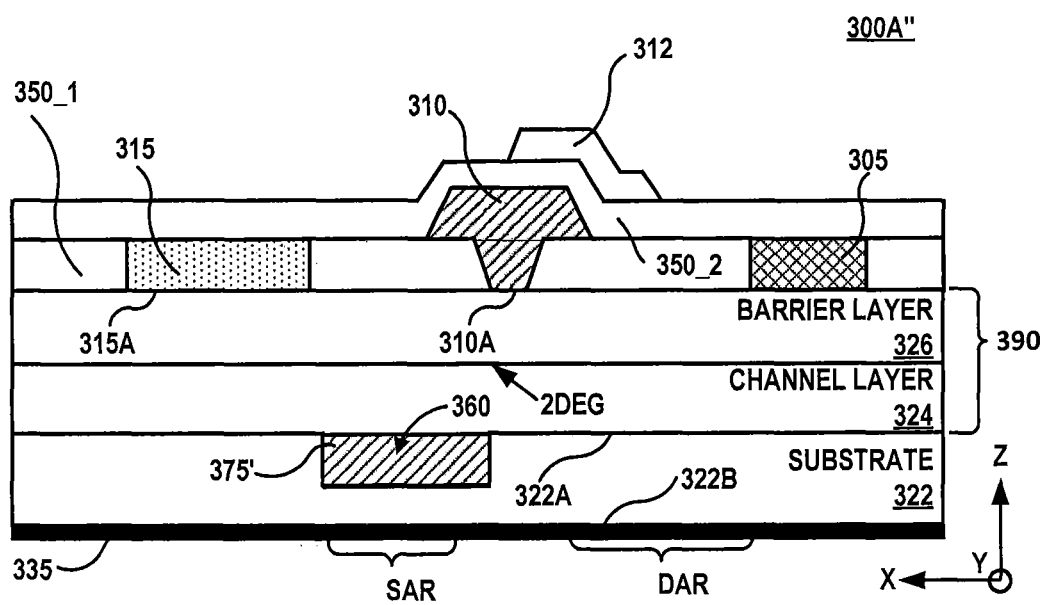

For example, FIGS. 7A to 7C are cross-sectional views illustrating an embodiment of a semiconductor device 300A, 300A', 300A" implemented as a HEMT, according to some embodiments of the present disclosure. The cross-sections illustrated in FIGS. 7A to 7C are taken along line A-A of either FIG. 1B or FIG. 1C. FIGS. 7A to 7C are intended to represent structures for identification and description and are not intended to represent the structures to physical scale.

Referring to semiconductor device 300A FIG. 7A, a semiconductor structure 390, such as a semiconductor structure for a Group III nitride semiconductor HEMT, may be formed on a substrate 322 such as a silicon carbide SiC substrate or a sapphire substrate. The substrate 322 may be a semi-insulating silicon carbide (SiC) substrate that may be, for example, the 4H polytype of silicon carbide. Other silicon carbide candidate polytypes may include the 3C, 6H, and 15R polytypes. The substrate may be a High Purity Semi-Insulating (HPSI) substrate, available from Cree, Inc.

In some embodiments, the silicon carbide bulk crystal of the substrate 322 may have a resistivity equal to or higher than about $1 \times 10^5$ ohm-cm at room temperature. Example SiC substrates that may be used in some embodiments of the present disclosure are manufactured by, for example, Cree, Inc., of Durham, N.C., the assignee of the present disclosure, and methods for producing such substrates are described, for example, in U.S. Pat. No. Re. 34,861, U.S. Pat. Nos. 4,946,547, 5,200,022, and 6,218,680, the disclosures of which are incorporated by reference herein in their entireties. Although silicon carbide may be used as a substrate material, embodiments of the present disclosure may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like. The substrate 322 may be a silicon carbide wafer, and the HEMT device 300A may be formed, at least in part, via wafer-level processing, and the wafer may then be diced to provide a plurality of individual high electron mobility transistors 300A.

The substrate 322 may have a lower surface 322B and an upper surface 322A. In some embodiments, the substrate 322 of the HEMT device 300A may be a thinned substrate 322. In some embodiments, the thickness of the substrate 322 (e.g., in a vertical Z direction in FIG. 7A) may be 100 µm or less. In some embodiments, the thickness of the substrate 322 may be 75 µm or less. In some embodiments, the thickness of the substrate 322 may be 50 µm or less.

A recess region 360 may be formed in the substrate 322. The characteristics of the recess region 360 may be similar to those illustrated and described herein with respect to FIG. 1A and, as a result, a duplicate description thereof will be omitted. The recess region 360 may be formed as a continuous trench similar to that of FIG. 1B or may be formed as a series of separated trenches similar to that of FIG. 1C.

A channel layer 324 is formed on the upper surface 322A of the substrate 322 (or on the optional layers described further herein) and within the recess region 360, and a barrier layer 326 is formed on an upper surface of the channel layer 324. The channel layer 324 and the barrier layer 326 may each be formed by epitaxial growth in some embodiments. Techniques for epitaxial growth of Group III nitrides have been described in, for example, U.S. Pat. Nos. 5,210,051, 5,393,993, and 5,523,589, the disclosures of which are also incorporated by reference herein in their entireties. The channel layer 324 may have a bandgap that is less than the bandgap of the barrier layer 326 and the channel layer 324 may also have a larger electron affinity than the barrier layer 326. The channel layer 324 and the barrier layer 326 may include Group III-nitride based materials. In some embodiments, a thickness of the wafer (e.g., the thickness of the substrate 322, the channel layer 324, and the barrier layer 326) may be between 40 µm to about 100 µm. In some embodiments, the wafer thickness may be between 40 µm to about 80 µm. In some embodiments, the wafer thickness may be approximately 75 µm.

In some embodiments, the channel layer 324 may be a Group III nitride, such as $Al_xGa_{1-x}N$, where $0 \le x < 1$, provided that the energy of the conduction band edge of the channel layer 324 is less than the energy of the conduction band edge of the barrier layer 326 at the interface between the channel and barrier layers 324, 326. In certain embodiments of the present disclosure, x=0, indicating that the channel layer 324 is GaN. The channel layer 324 may also be other Group III-nitrides such as InGaN, AlInGaN or the like. The channel layer 324 may be undoped ("unintentionally doped") and may be grown to a thickness of greater than about 0.002 µm. The channel layer 324 may also be a multi-layer structure, such as a superlattice or combinations of GaN, AlGaN or the like. The channel layer 324 may be under compressive strain in some embodiments.

The material of the channel layer 324 may be on and in the recess region 360. In some embodiments, the material of the channel layer 324 may completely fill the recess region 360, but the embodiments of the present disclosure are not limited thereto.

In some embodiments, the barrier layer 326 is AlN, AlInN, AlGaN or AlInGaN or combinations of layers thereof. The barrier layer 326 may comprise a single layer or may be a multi-layer structure. In some embodiments, the barrier layer 326 may be a thin AlN layer directly on the channel layer 324 and a single AlGaN or multiple layers thereon. In particular embodiments of the present disclosure, the barrier layer 326 may be thick enough and may have a high enough aluminum (Al) composition and doping to induce a significant carrier concentration at the interface between the channel layer 324 and the barrier layer 326 through polarization effects when the barrier layer 326 is buried under ohmic contact metal. The barrier layer 326 may, for example, be from about 0.1 nm to about 30 nm thick, but is not so thick as to cause cracking or substantial defect formation therein. In some embodiments, the thickness of the barrier layer is between 13 and 18 nm. In certain embodiments, the barrier layer 326 is undoped or doped with an n-type dopant to a concentration less than about $10^{19}$ cm$^{-3}$. In some embodiments, the barrier layer 326 is $Al_xGa_{1-x}N$ where $0<x<1$. In particular embodiments, the aluminum concentration is about 25%. However, in other embodiments of the present disclosure, the barrier layer 326 comprises AlGaN with an aluminum concentration of between about 5% and less than about 100%. In specific embodiments of the present disclosure, the aluminum concentration is greater than about 10%. The channel layer 324 and/or the barrier layer 326 may be deposited, for example, by metal-organic chemical vapor deposition (MOCVD), molecular beam epitaxy (MBE), or hydride vapor phase epitaxy (HVPE). As discussed herein, a 2DEG layer is induced in the channel layer 324 at a junction between the channel layer 324 and the barrier layer 326. The 2DEG layer acts as a highly conductive layer that allows conduction between the source and drain regions of the device that are beneath the source contact 315 and the drain contact 305, respectively. The channel layer 324 and the barrier layer 326 form the semiconductor structure 390.

While the semiconductor structure 390 is shown with channel layer 324 and barrier layer 326 for purposes of illustration, the semiconductor structure 390 may include additional layers/structures/elements such as a buffer and/or nucleation layer(s) between channel layer 324 and substrate 322, and/or a cap layer on barrier layer 326. HEMT structures including substrates, channel layers, barrier layers, and other layers are discussed by way of example in U.S. Pat. Nos. 5,192,987, 5,296,395, 6,316,793, 6,548,333, 7,544,963, 7,548,112, 7,592,211, 7,615,774, and 7,709,269, the disclosures of which are hereby incorporated herein in their entirety by reference. For example, an AlN buffer layer may be formed on the upper surface 322A of the substrate 322 to provide an appropriate crystal structure transition between the silicon carbide substrate 322 and the remainder of the HEMT device 300A. Additionally, strain balancing transition layer(s) may also and/or alternatively be provided as described, for example, in commonly assigned U.S. Pat. No. 7,030,428, the disclosure of which is incorporated herein by reference as if set forth fully herein. The optional buffer/nucleation/transition layers may be deposited by MOCVD, MBE, and/or HVPE. When present, at least a portion of the buffer/nucleation/transition layers may be within the recess region 360, but the embodiments of the present disclosure are not limited thereto.

The source contact 315 and the drain contact 305 may be formed on an upper surface 326A of the barrier layer 326 and may be laterally spaced apart from each other. A gate contact 310 may be formed on the upper surface 326A of the barrier layer 326 between the source contact 315 and the drain contact 305. The material of the gate contact 310 may be chosen based on the composition of the barrier layer 326, and may, in some embodiments, be a Schottky contact. Conventional materials capable of making a Schottky contact to a gallium nitride-based semiconductor material may be used, such as, for example, nickel (Ni), platinum (Pt), nickel silicide ($NiSi_x$), copper (Cu), palladium (Pd), chromium (Cr), tungsten (W) and/or tungsten silicon nitride (WSiN).

The source contact 315 and the drain contact 305 may include a metal that can form an ohmic contact to a gallium nitride-based semiconductor material. Suitable metals may include refractory metals, such as Ti, W, titanium tungsten (TiW), silicon (Si), titanium tungsten nitride (TiWN), tungsten silicide (WSi), rhenium (Re), Niobium (Nb), Ni, gold (Au), aluminum (Al), tantalum (Ta), molybdenum (Mo), $NiSi_x$, titanium silicide (TiSi), titanium nitride (TiN), WSiN, Pt and the like. In some embodiments, the source contact 315 may be an ohmic source contact 315. Thus, the source contact 315 and the drain contact 305 may contain an ohmic contact portion in direct contact with the barrier layer 326. In some embodiments, the source contact 315 and/or the drain contact 305 may be formed of a plurality of layers to form an ohmic contact that may be provided as described, for example, in commonly assigned U.S. Pat. Nos. 8,563,372 and 9,214,352, the disclosures of which are hereby incorporated herein in their entirety by reference.

The source contact 315 may be coupled to a reference signal such as, for example, a ground voltage. In some embodiments, the coupling to the reference signal may be provided by a via (not shown) that extends from the lower surface 322B of the substrate 322, through the substrate 322 to the upper surface 326A of the barrier layer. A backmetal layer 335 may be formed on the lower surface 322B of the substrate 322. In some embodiments, the backmetal layer 335 may directly contact the source contact 315 (e.g., through the use of the via not illustrated in FIG. 7A). In some embodiments, the backmetal layer 335 may be indirectly electrically connected to the source contact 315 via additional conductive paths. Thus, the backmetal layer 335, and a signal coupled thereto, may be electrically connected to the source contact 315.

In some embodiments, the recess region 360 may be disposed within the substrate 322 in such a way that the recess region 360 does not vertically overlap (e.g., in the Z direction in FIG. 7A) the source contact 315. For example, the recess region 360 may not vertically overlap an interface 315A between the source contact 315 and the barrier layer 326. In some embodiments, the recess region 360 may not vertically overlap an interface 310A between the gate contact 310 and the barrier layer 326. However, the embodiments of the present disclosure are not limited to such a configuration. In some embodiments, a portion of the recess region 360 may vertically overlap the source contact 315.

Referring to FIG. 7A, a first insulating layer 350_1 may be formed on the barrier layer 326 and a second insulating layer 350_2 may be formed on the first insulating layer 350_1. In some embodiments, the first insulating layer 350_1 and/or the second insulating layer 350_2 may include silicon nitride ($Si_xN_y$), aluminum nitride (AlN), silicon dioxide ($SiO_2$), and/or other suitable protective material. The thickness of the first insulating layer 350_1 may affect the gate-to-source capacitance and the gate-to-drain capacitance, which can impact the switching speed of the semiconductor device 300A. Similarly, the thickness of the second insulating layer 350_2 may affect gate-to-drain capacitance, which can impact the switching speed and gain of the semiconductor device 300A.

The source contact 315 and the drain contact 305 may be formed in the first insulating layer 350_1, portions of each of which may be under the second insulating layer 350_2. It will be understood that the present invention is not limited to a particular shape of the gate contact 310 illustrated in FIG. 7A, and that other shapes of the gate contact 310, as well as the other elements of the semiconductor device 300A, are possible without deviating from the embodiments described herein. In some embodiments, the gate contact 310 may be closer to the source contact 315 than the drain contact 305. In some embodiments, the gate contact 310 may be formed as a T-shaped gate and/or a gamma gate, the formation of which is discussed by way of example in U.S. Pat. Nos. 8,049,252, 7,045,404, and 8,120,064, the disclosures of which are hereby incorporated herein in their entirety by reference. The second insulating layer 350_2 may be formed on the first insulating layer 350_1 and on portions of the drain contact 305, gate contact 310, and source contact 315.

Field plates 312 may be formed on the second insulating layer 350_2. At least a portion of a field plate 312 may be on the gate contact 310. At least a portion of the field plate 312 may be on a portion of the second insulating layer 350_2 that is between the gate contact 310 and the drain contact 305. The field plate 312 can reduce the peak electric field in the HEMT device 300A, which can result in increased breakdown voltage and reduced charge trapping. The reduction of the electric field can also yield other benefits such as reduced leakage currents and enhanced reliability. Field plates and techniques for forming field plates are discussed, by way of example, in U.S. Pat. No. 8,120,064, the disclosure of which is hereby incorporated herein in its entirety by reference. The field plate 312 is optional and, in some embodiments, may be omitted. For ease of illustration, the first and second insulating layers 350_1, 350_2, and the field plates 312 are not illustrated in FIGS. 1A, 1B, and 1C.

The configuration of the recess region 360 of the HEMT device 300A is not limited to that of FIG. 7A. FIGS. 7B and 7C illustrate embodiments of the HEMT device 300A', 300A" that include recess regions 360 similar to those illustrated herein in FIGS. 2 and 3.

Referring to the semiconductor device 300A' of FIG. 7B, an impurity region 375 may be formed in the substrate 322 on a bottom surface and/or one or more of the sidewalls of the trench forming the recess region 360. In some embodiments, the impurity region 375 may be doped with impurities (e.g., by ion implantation) to be p-type. The characteristics of the impurity region 375 may be similar to those illustrated and described herein with respect to FIG. 2 and, as a result, a duplicate description thereof will be omitted.

Referring to the semiconductor device 300A" of FIG. 7C, portions of the channel layer 324 (and/or other optional layers described herein) within the recess region 360 may be doped to form the impurity region 375'. In some embodiments, the impurity conductivity type of the impurity region 375' may be different than the channel layer 324. For example, in some embodiments, the impurity region 375' may be a p-type region and the channel layer 324 may be doped to be n-type. In some embodiments, the impurity region 375' and the channel layer 324 may have the same conductivity type (e.g., both p-type), but a concentration of the dopants within the impurity region 375' may be higher than that of the channel layer 324. The characteristics of the impurity region 375' may be similar to those illustrated and described herein with respect to FIG. 3 and, as a result, a duplicate description thereof will be omitted.

Figure 8A:
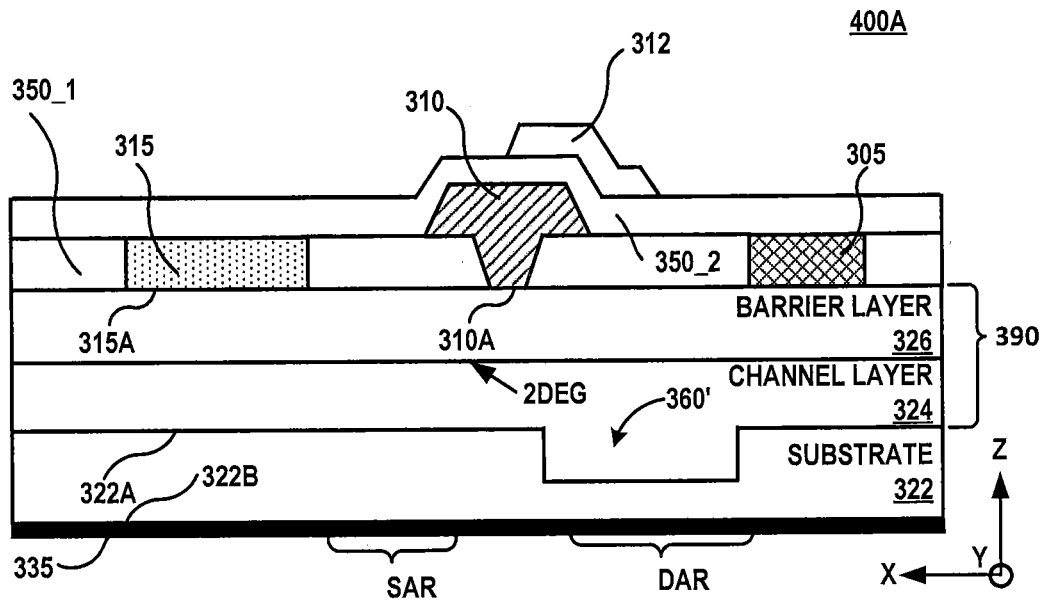
FIGS. 8A and 8B are cross-sectional views illustrating an embodiment of a semiconductor device, according to some embodiments of the present disclosure.
Figure 8B:
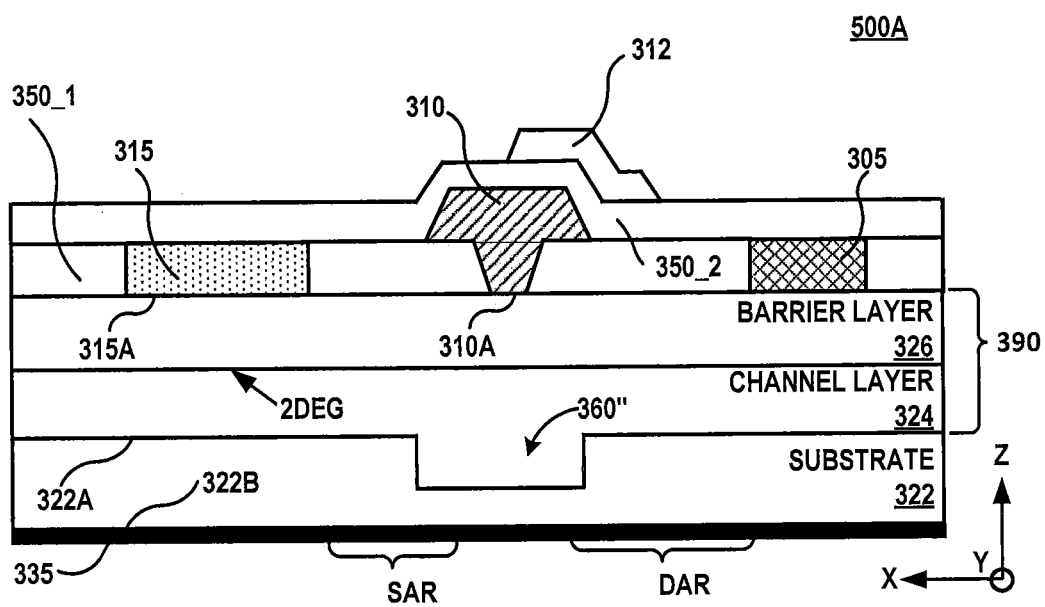

FIGS. 7A to 7C illustrate embodiments of a HEMT device 300A, 300A', 300A" in which the recess region 360 is provided under the source access region. However, the embodiments of the present disclosure are not limited thereto. FIGS. 8A and 8B are cross-sectional views illustrating an embodiment of a semiconductor device 400A, 500A implemented as a HEMT, according to some embodiments of the present disclosure. The cross-section illustrated in FIG. 8A is taken along line A-A of either FIG. 4D or FIG. 4E. The cross-section illustrated in FIG. 8B is taken along line A-A of either FIG. 5D or FIG. 5E. FIGS. 8A and 8B are intended to represent structures for identification and description and are not intended to represent the structures to physical scale.

For example, FIG. 8A illustrates an embodiment of a HEMT device 400A in which a recess region 360' is provided under the drain access region in a manner similar to that of FIGS. 4A to 4C. The recess region 360' may be formed as a continuous trench similar to that of FIG. 4D or may be formed as a series of separated trenches similar to that of FIG. 4E. Though not illustrated in FIG. 8A, the HEMT device 400A may also include an impurity region 475 such as that illustrated in FIG. 4B or an impurity region 475' such as that illustrated in FIG. 4C.

FIG. 8B illustrates an embodiment of a HEMT device 500A in which a recess region 360" is provided under the drain access region in a manner similar to that of FIGS. 5A to 5C. The recess region 360" may be formed as a continuous trench similar to that of FIG. 5D or may be formed as a series of separated trenches similar to that of FIG. 5E. Though not illustrated in FIG. 8B, the HEMT device 500A may also include an impurity region 575 such as that illustrated in FIG. 5B or an impurity region 575' such as that illustrated in FIG. 5C.

FIGS. 9A to 9G illustrate a method of fabricating a semiconductor device, such as the HEMT device 300A of FIG. 7A, according to embodiments of the present disclosure. FIGS. 9A to 9G are taken along line C-C of FIG. 1B.

Figure 9A:
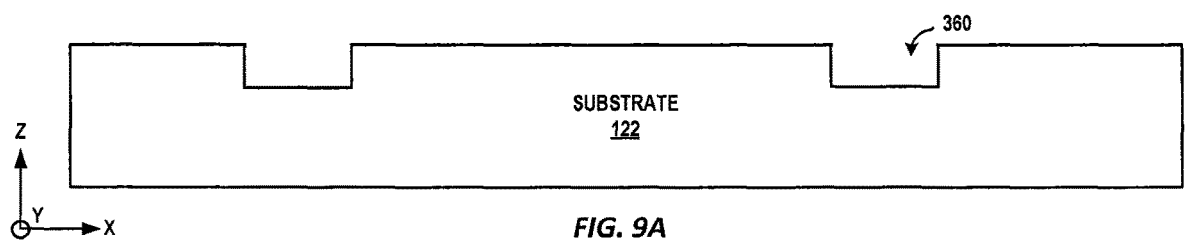
FIGS. 9A to 9G illustrate a method of fabricating a semiconductor device, according to embodiments of the present disclosure.

Referring now to FIG. 9A, a substrate 122 is provided on which a semiconductor structure may be formed. The substrate 122 may be a semi-insulating silicon carbide (SiC) substrate that may be, for example, the 4H polytype of silicon carbide. Other silicon carbide candidate polytypes may include the 3C, 6H, and 15R polytypes. A thickness of the substrate 122 may be 100 μm or greater.

Silicon carbide has a much closer crystal lattice match to Group III nitrides (which may be employed in the channel layer 324 and/or the barrier layer 326) than does sapphire ($Al_2O_3$), which may be a common substrate material for Group III nitride devices. The closer lattice match may result in Group III nitride films of higher quality than those generally available on sapphire. Silicon carbide also has a relatively high thermal conductivity, and as such, the total output power of Group III nitride devices formed on silicon carbide may not be as limited by thermal dissipation of the substrate as similar devices formed on sapphire and/or silicon. Also, semi-insulating silicon carbide substrates may provide for device isolation and reduced parasitic capacitance.

It is to be understood that, although silicon carbide may be employed as a substrate, embodiments of the present invention may utilize any suitable substrate for the substrate 122, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like.

Optional buffer, nucleation and/or transition layers (not shown) may also be provided on the substrate 122. For example, an AlN buffer layer may be provided to provide an appropriate crystal structure transition between a silicon carbide substrate and the remainder of the device. Additionally, strain balancing transition layer(s) may also be provided.

A recess region 360 may be formed in an upper surface of the substrate 122. The recess region 360 may be provided, for example, by forming a mask on the upper surface of the substrate 122 and patterning the mask to expose portions of the upper surface of the substrate 122 where a location of the recess region 360 is desired, such as within an area that is intended to be below the source access region, below the drain access region, or below the gate of the resulting device. The exposed portions of the upper surface of the substrate 122 may then be etched using the patterned mask to form the recess region 360.

Figure 9B:
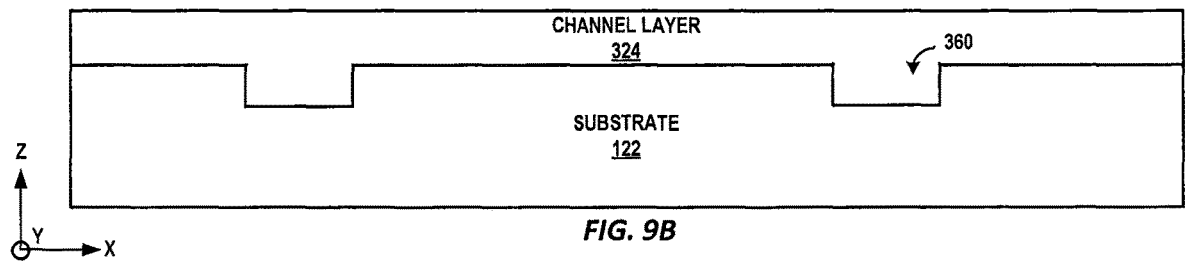
Figure 9C:
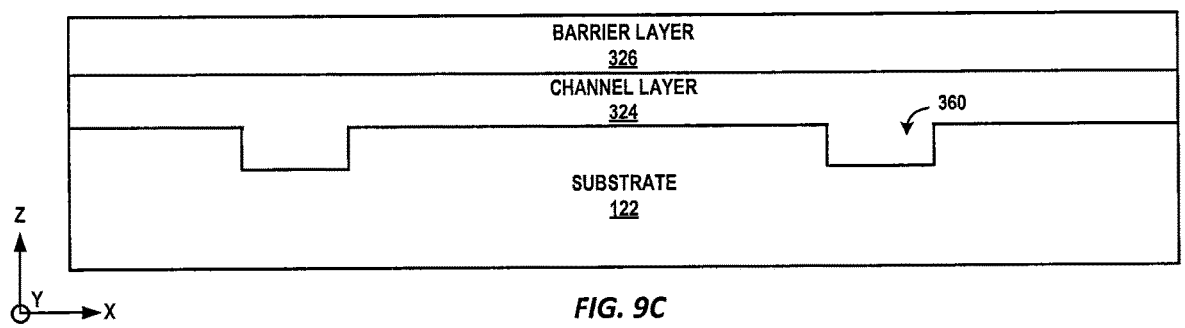

Referring to FIG. 9B, a channel layer 324 is provided on the substrate 122 and within the recess region 360. The channel layer 324 may be deposited on the substrate 122 using buffer layers, transition layers, and/or nucleation layers as described above. The channel layer 324 may be under compressive strain. Furthermore, the channel layer 324 and/or buffer, nucleation, and/or transition layers may be deposited by MOCVD, MBE, and/or HYPE. In some embodiments of the present invention, the channel layer 324 may be a Group III-nitride layer.

Referring to FIG. 9B, a barrier layer 326 may be formed on the channel layer 324. The barrier layer 326 may be a Group III-nitride layer. In certain embodiments of the present invention, the barrier layer 326 may be a highly-doped n-type layer. For example, the barrier layer 326 may be doped to a concentration of less than about $10^{19}$ cm$^{-3}$.

In some embodiments of the present invention, the barrier layer 326 may have a thickness, Al composition, and/or doping sufficient to induce a significant carrier concentration at the interface between the channel layer 324 and the barrier layer 326 through polarization effects when the barrier layer 326 is buried under ohmic contact metal. Also, the barrier layer 326 may be thick enough to reduce or minimize scattering of electrons in the channel due to ionized impurities deposited at the interface between the barrier layer 326 and a subsequently formed first protective layer.

In some embodiments, the channel layer 324 and the barrier layer 326 may have different lattice constants. For example, the barrier layer 326 may be a relatively thin layer having a smaller lattice constant than the channel layer 324, such that the barrier layer 326 "stretches" at the interface between the two. Accordingly, a pseudomorphic HEMT (pHEMT) device may be provided.

Figure 9D:
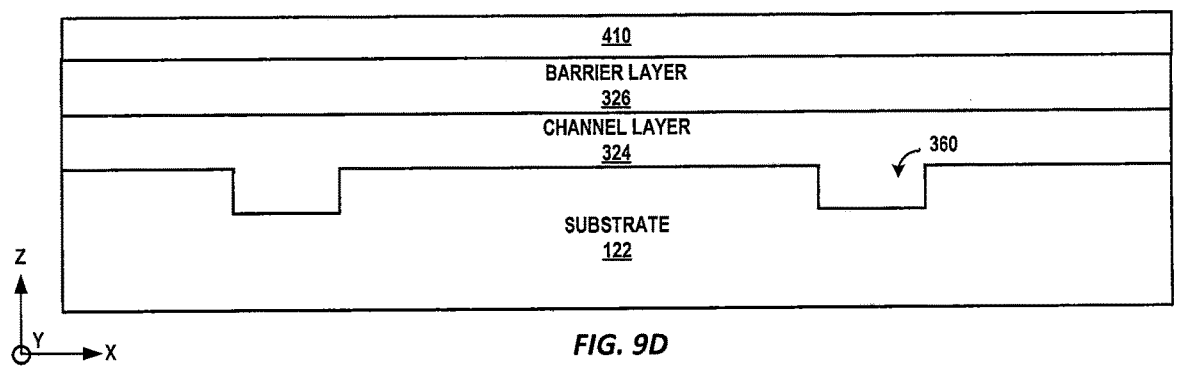

Referring to FIG. 9D, a first protective layer 410 is formed on the barrier layer 326. The first protective layer 410 may be dielectric material, such as silicon nitride ($Si_xN_y$), aluminum nitride (AlN), silicon dioxide ($SiO_2$), and/or other suitable protective material. Other materials may also be utilized for the first protective layer 410. For example, the first protective layer 410 may also include magnesium oxide, scandium oxide, aluminum oxide and/or aluminum oxynitride. Furthermore, the first protective layer 410 may be a single layer or may include multiple layers of uniform and/or non-uniform composition.

The first protective layer 410 may be blanket formed on the barrier layer 326. For example, the first protective layer 410 may be a silicon nitride (SiN) layer formed by high quality sputtering and/or plasma-enhanced chemical vapor deposition (PECVD), The first protective layer 410 may be sufficiently thick so as to protect the underlying barrier layer 326 during a subsequent anneal of ohmic contacts.

Figure 9E:
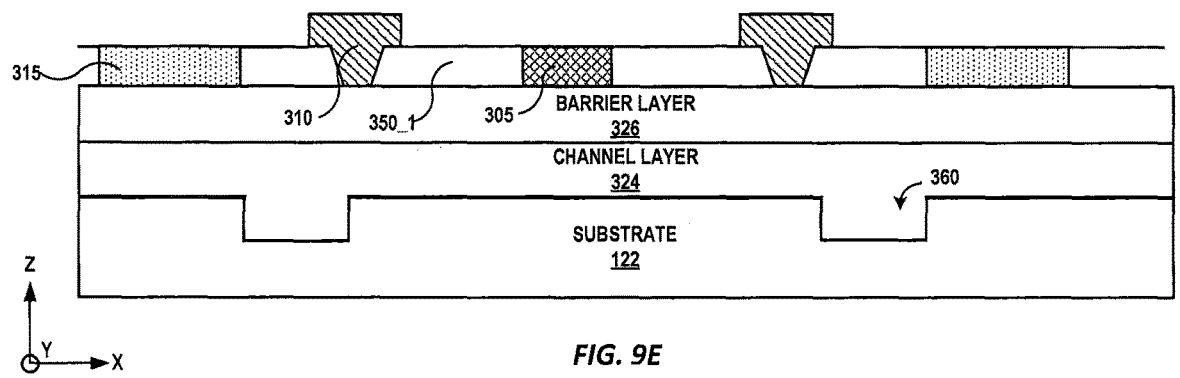

Referring to FIG. 9E, the first protective layer 410 (see FIG. 9D) may be patterned to form openings for source contacts 315, gate contacts 310, and drain contacts 305. For example, the first protective layer 410 may be patterned to form windows which expose the barrier layer 326 for placement of the source contact 315 and the drain contacts 305. The windows may be etched utilizing a patterned mask and a low-damage etch with respect to the barrier layer 326. Ohmic metal may be formed on the exposed portions of the barrier layer 326. The ohmic metal may be annealed to provide the source contacts 315 and the drain contacts 305.

The first protective layer 410 may also be patterned to provide the gate contacts 310. The first protective layer 410 may be etched to form windows which expose the barrier layer 326 for placement of the gate contact 310. The gate contacts 310 may be formed within the etched windows, and may extend through the first protective layer 410 to contact the exposed portion of the barrier layer 326. Suitable gate materials may depend on the composition of the barrier layer 326. However, in certain embodiments, conventional materials capable of making a Schottky contact to a nitride based semiconductor material may be used; such as Ni, Pt, NiSi$_x$, Cu, Pd, Cr, TaN, W, and/or WSiN. Portion of the gate contacts 310 may extend on a surface of the first protective layer 410. The formation of the source contacts 315, gate contacts 310, and drain contacts 305 may result in the patterning of the first protective layer 410 of FIG. 9D to form the first insulating layer 350_1.

Though the source contact 315 is illustrated as being on the top surface of the barrier layer 326 in FIG. 9E, it will be understood that, in some embodiments, the source contacts 315, gate contacts 310, and/or drain contacts 305 may be formed within recesses in the top surface of the barrier layer 326.

Figure 9F:
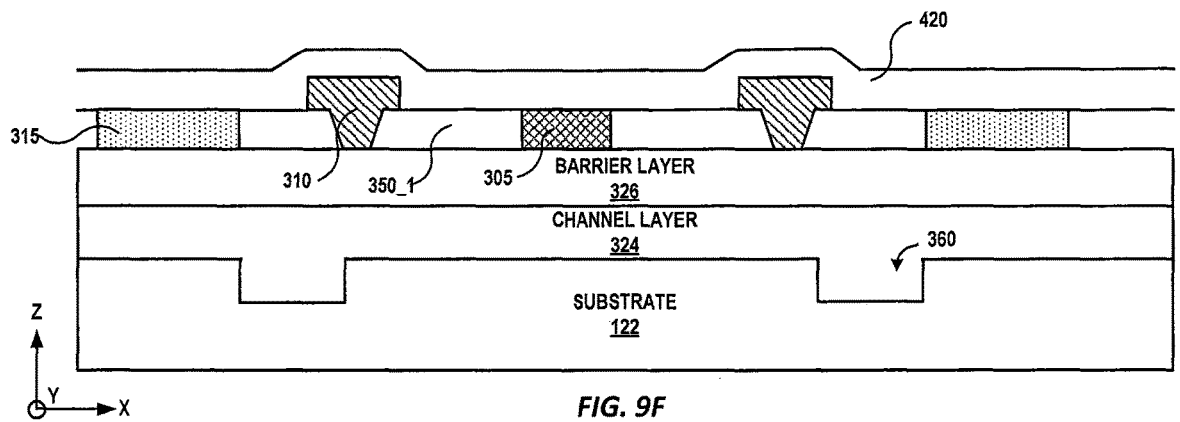

Referring to FIG. 9F, a second protective layer 420 may be formed on the first insulating layer 350, the source contacts 315, gate contacts 310, and drain contacts 305. The second protective layer 420 may be a dielectric layer. In some embodiments, the second protective layer 42Q may have a different dielectric index than the first insulating layer 350_1.

Figure 9G:
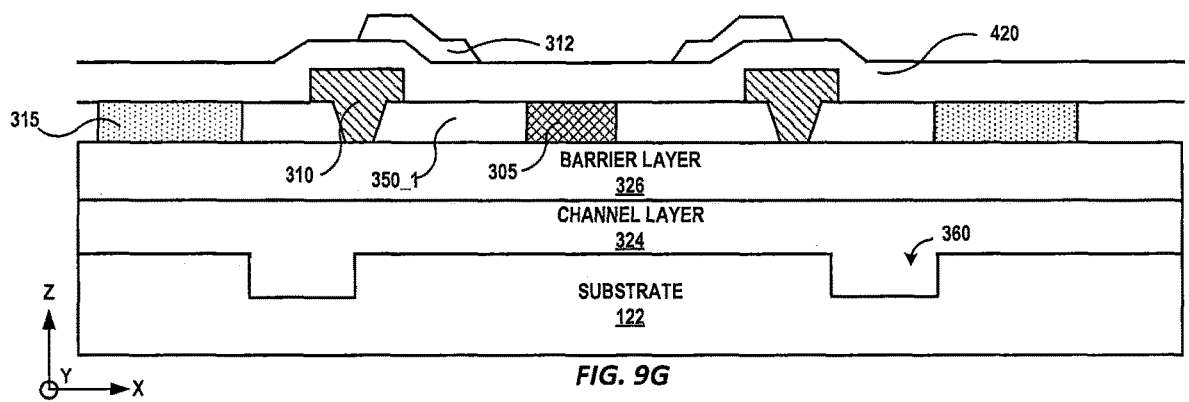

Referring to FIG. 9G, field plates 312 may be formed on the second protective layer 420. The field plate 312 may overlap the gate contact 310 (e.g., in the Z direction of FIG. 9F) and may extend a distance on the region between the gate and the drain (i.e., the gate-drain region). An overlap of the field plate 312 over the gate contact 310 and/or the distance the field plate 312 extends on the gate-drain region can be varied for optimum results. In some embodiments, the field plate 312 can be electrically connected to the gate contact 310 or the source contact 315, and it is understood that field plate structures other than those illustrated in the figures may be used without deviating from the invention. In some embodiments, the field plate 312 may be omitted.

Referring back to FIG. 7A, the substrate 122 (see FIG. 9F) may be thinned to form the thinned substrate 322. In some embodiments, the thickness of the substrate 322 is reduced using a grinder, such as an in-feed or creep feed grinder. In other embodiments, the thickness of the substrate 322 is reduced using lapping, chemical or reactive ion etching or combinations of these approaches with or without grinding. In still other embodiments, etching may be used to treat the backside of the substrate 322 to reduce damage to the substrate 322 that may result from the thinning operation. Methods of thinning a wafer are described, for example, in commonly assigned U.S. Pat. Nos. 7,291,529, 7,932,111; 7,259,402; and 8,513,686, the disclosures of which are incorporated herein by reference in their entirety.

In some embodiments according to the invention, the substrate 322 is thinned to a thickness of between about 40 μm to about 100 μm. In other embodiments, the substrate 322 is thinned to a thickness of between about 40 μm to about 75 μm. In some embodiments, the thinning of the substrate 122 is omitted, and the substrate 122 is effectively identical to the substrate 322.

A backmetal layer 335 may be deposited on the lower surface 322B of the substrate 322. The backmetal layer 335 may include a conductive metal such as, for example, titanium, platinum, and/or gold. The backmetal layer 335 may be electrically connected (e.g., by way of a conductive via or other conductive path) to the source contact 315.

Figure 10A:
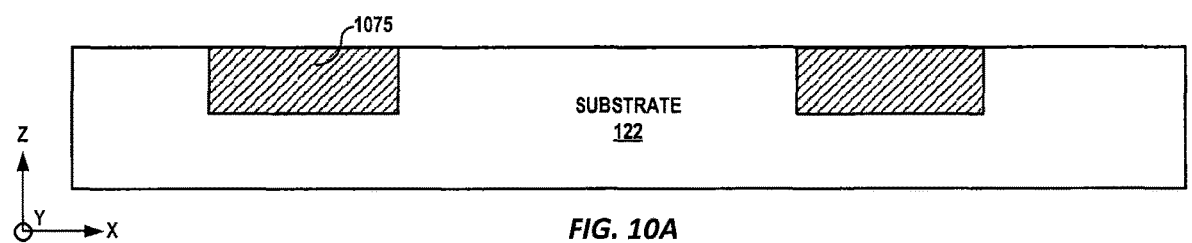
FIGS. 10A to 10D illustrate methods for constructing additional semiconductor devices according to some embodiments of the present disclosure.
Figure 10B:
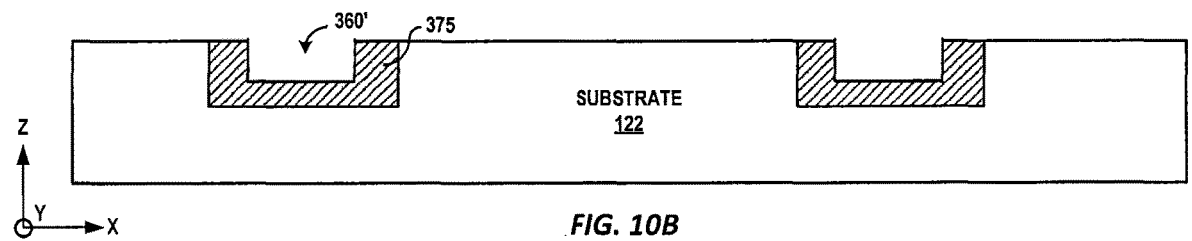

FIGS. 10A to 10D illustrate methods for constructing additional semiconductor devices according to some embodiments of the present disclosure. For example, FIGS. 10A and 10B illustrate methods for forming the impurity region 375 to construct, for example, the semiconductor device 300' of FIG. 2. Referring to FIG. 10A, a doped region 1075 may be formed in the substrate 122. The doped region 1075 may be formed, for example, by ion implantation into the substrate 122. In some embodiments, the substrate 122 may be n-type and the doped region 1075 may be formed to be p-type.

Referring to FIG. 10B, recess region 360' may be formed in an upper surface of the substrate 122 and within the doped region 1075. The recess region 360' may be provided, for example, by forming a mask on the upper surface of the substrate 122 and patterning the mask to expose portions of the upper surface of the substrate 122 and the doped region 1075 where a location of the recess region 360' is desired, such as within an area that is intended to be below the source access region of the resulting device. Etching the recess region 360' may be performed so that a depth of the recess region 360' (e.g., from the upper surface of the substrate 122) and/or a width of the recess region 360' does not exceed that of the doped region 1075. After the etching of the recess region 360', the impurity region 375 may be formed on the sidewalls and/or bottom surface of the recess region 360'. Subsequently, the operations of 9B to 9G may be performed to form the device incorporating the recess region 360'.

Figure 10C:
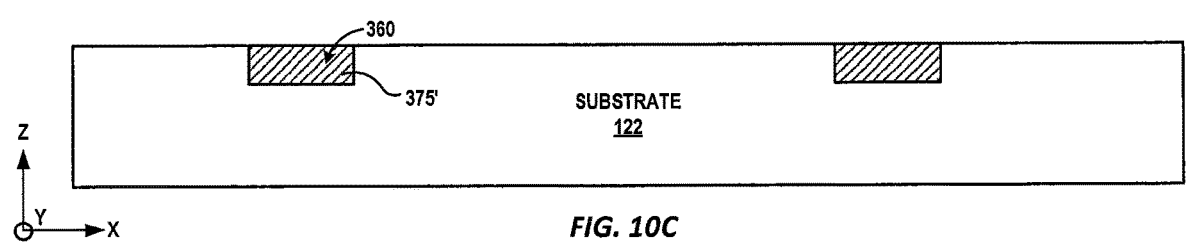
Figure 10D:
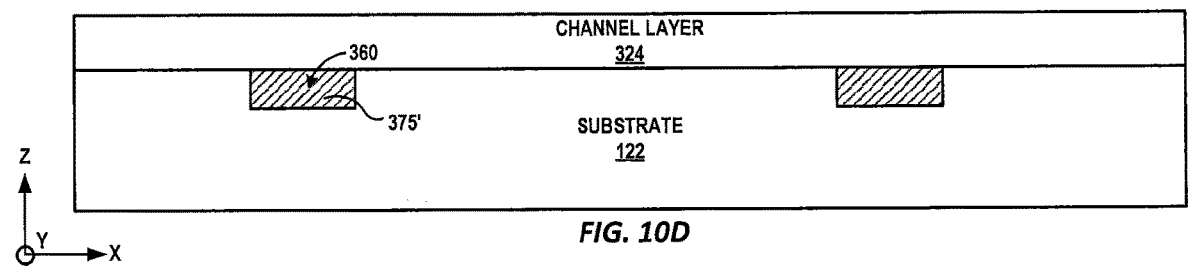

FIGS. 10C and 10D illustrate methods for forming the impurity region 375' to construct, for example, the semiconductor device 300" of FIG. 3.

The operations of FIG. 10C may be performed after the operations illustrated in FIG. 9A. Referring to FIG. 10C, an impurity region 375' may be formed in the recess region 360. For example, the impurity region 375' may be formed by ion implantation. In some embodiments, the impurity region 375' may be deposited within the recess region 360 in the substrate 122. For example, the impurity region 375' may be deposited by MOCVD, MBE, and/or HVPE. In some embodiments, the impurity region 375' may be a Group III-nitride layer, such as GaN. The impurity region 375' may be doped, either after or during its formation, to be p-type.

Referring to FIG. 10D, a channel layer 324 is provided on the substrate 122 and on the impurity region 375'. The channel layer 324 may be deposited on the substrate 122 and on the impurity region 375' using buffer layers, transition layers, and/or nucleation layers as described above. The channel layer 324 may be under compressive strain. Furthermore, the channel layer 324 and/or buffer, nucleation, and/or transition layers may be deposited by MOCVD, MBE, and/or HYPE. In some embodiments of the present invention, the channel layer 324 may be a Group III-nitride layer. In some embodiments, a material of the channel layer 324 may be the same as that of the impurity region 375'. Subsequently, the operations of 9C to 9G may be performed to form the device incorporating the recess region 360'.

Though FIGS. 9A to 9G and 10A to 10D illustrate embodiments in which a recess region 360 is formed in the source access region, the embodiments of the present disclosure are not limited thereto. As would be understood by those of ordinary skill in the art, the methods of FIGS. 9A to 9G and 10A to 10D may be similarly performed, mutatis mutandis, to create devices having a recess region 360' in the drain access region (as in the device 400, 400', 400" illustrated in FIGS. 4A to 4E) as well as devices having a recess region 360" beneath the gate contact (as in the device 500, 500', 500" illustrated in FIGS. 5A to 5E).

Figure 11A:
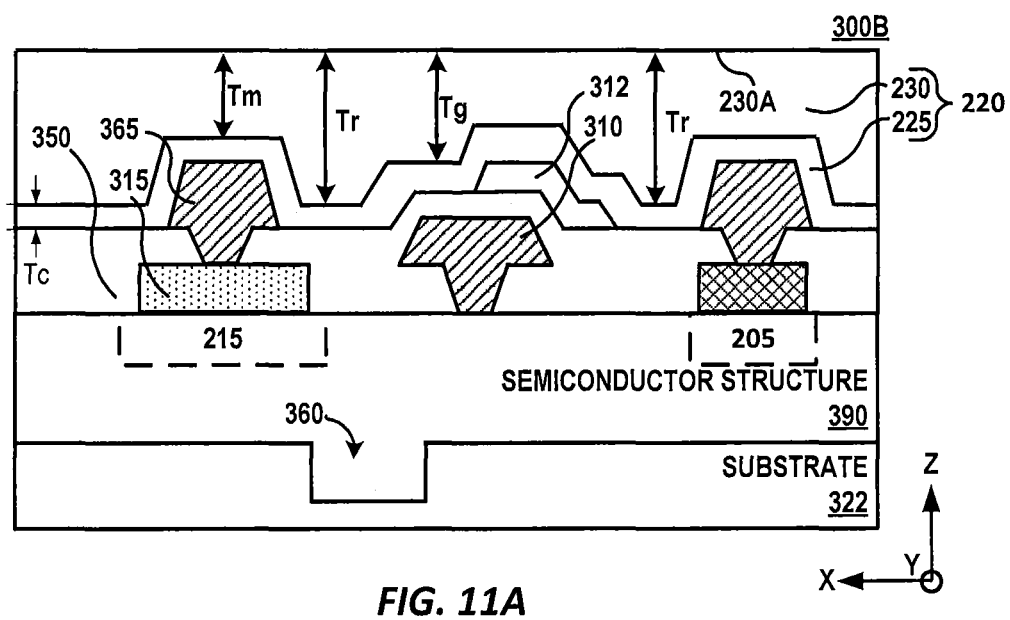
FIGS. 11A and 11B are schematic cross-sectional views of alternative transistor device structures, according to some embodiments of the present disclosure.
Figure 11B:
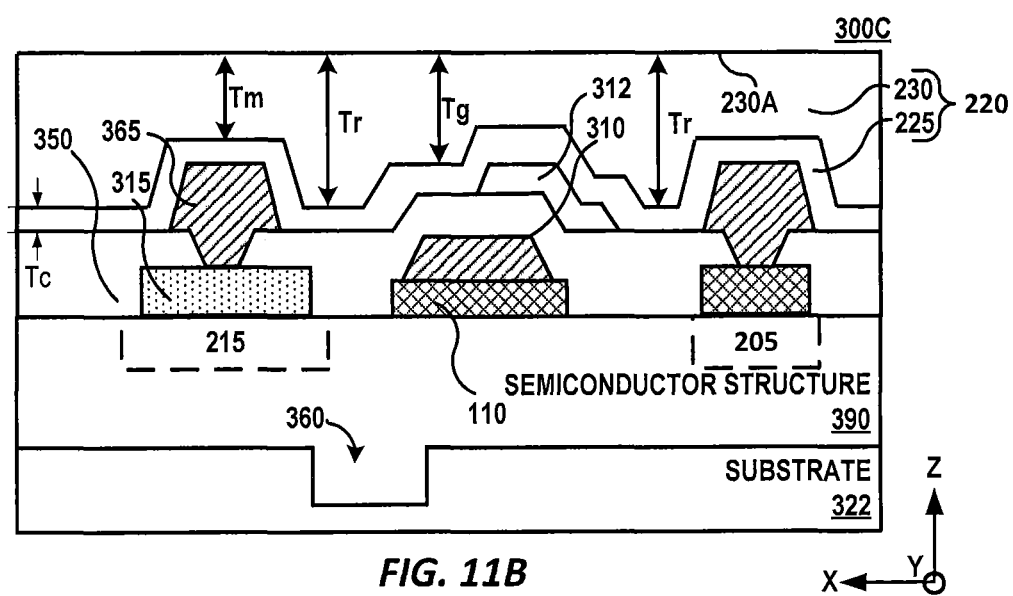

In addition, though semiconductor structures embodied as a HEMT device 300A, 300A', 300A" were illustrated in FIGS. 9A to 9G and 10A to 10D, it will be understood that the semiconductor structure 390 described herein may be provided using other types of semiconductor devices. Stated another way, other types of semiconductor devices may be used, and the methods of forming the recess region 360 may be applied to the semiconductor device without deviating from the scope of the present disclosure. FIGS. 11A and 11B illustrate example semiconductor devices 300B, 300C that can include the recess region 360, 360', 360" described herein. A duplicate description of elements of FIGS. 11A and 11B that have been described previously will be omitted. FIGS. 11A and 11B are taken generally along the lines A-A of FIGS. 1B, 1C.

FIG. 11A illustrates a Metal-Semiconductor Field Effect Transistor (MESFET) device 300B, where the region of the semiconductor structure 390 between the source and drain regions 215 and 205 provides the conduction channel or channel region of the MESFET 300B. The MESFET 300B may be formed on a substrate 322.

FIG. 11B illustrates a Metal-Oxide Semiconductor Field Effect Transistor (MOSFET) device 300C, where the region of the semiconductor structure 390 between the source and drain regions 215 and 205 provides the channel region of the MOSFET 300C, and the gate contact 310 is separated from the channel region by a gate oxide layer 110. The MOSFET 300C may be formed on a substrate 322

Each of the semiconductor devices 300B, 300C may include the recess region 360 in the substrate 322. Though FIGS. 11A and 11B illustrate embodiments in which a recess region 360 is formed in the source access region, the embodiments of the present invention are not limited thereto. The semiconductor devices 300B, 300C of FIG. 11A may also be embodied having a recess region 360' in the drain access region (as in the device 400, 400', 400" illustrated in FIGS. 4A to 4E) and/or having a recess region 360" beneath the gate contact (as in the device 500, 500', 500" illustrated in FIGS. 5A to 5E).

Figure 12A:
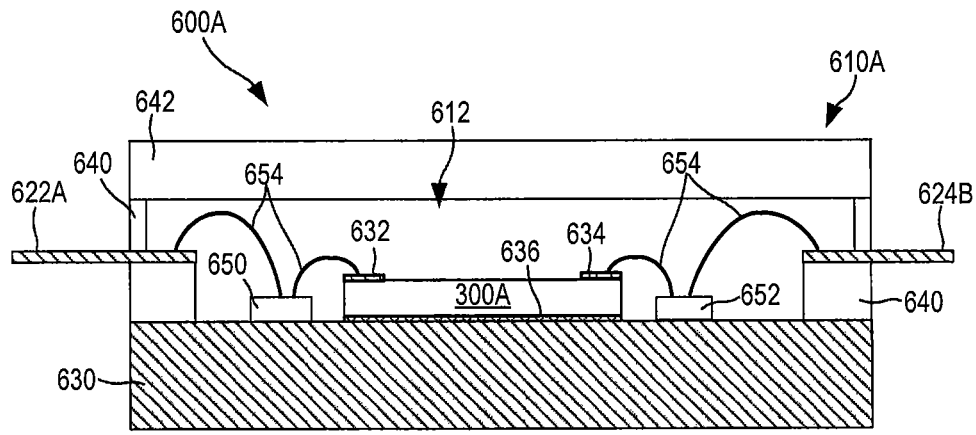
FIGS. 12A, 12B, and 12C are schematic cross-sectional views illustrating several example ways that that a semiconductor according to embodiments of the present disclosure may be packaged.
Figure 12B:
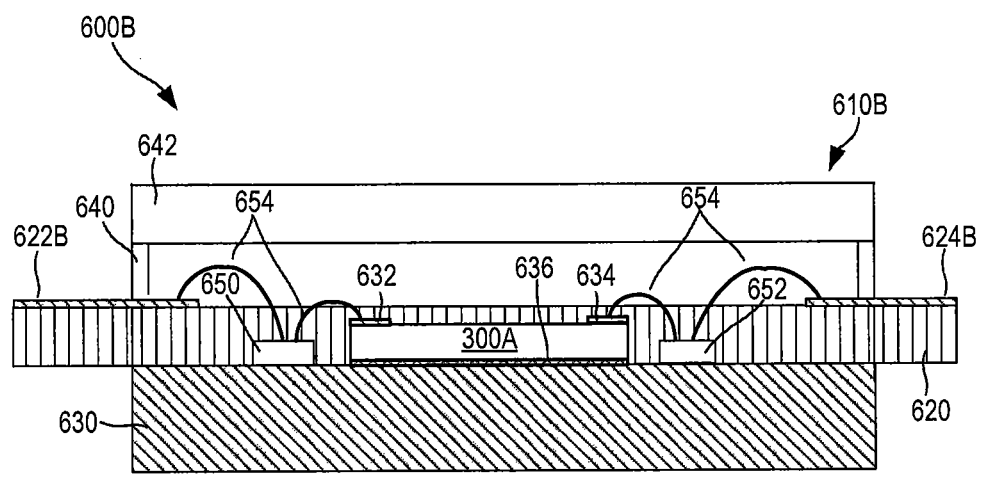
Figure 12C:
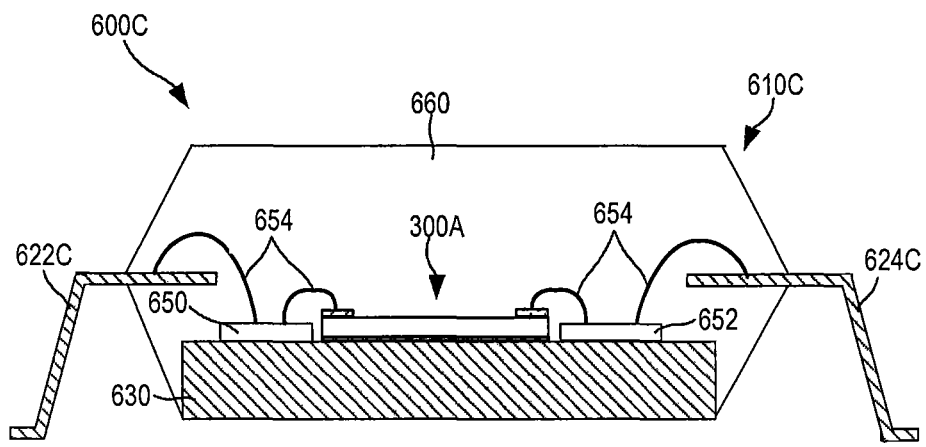

FIGS. 12A, 12B, and 12C are schematic cross-sectional views illustrating several example ways that that the semiconductor device 300A according to embodiments of the present disclosure may be packaged to provide packaged transistor devices 600A through 600C, respectively. While FIGS. 12A-12C show the semiconductor device 300A of FIG. 7A being packaged, it will be appreciated that any of the semiconductor devices 300A, 300A', 300A", 300B, 300C according to embodiments of the present disclosure may be packaged in the packages illustrated in FIGS. 12A-12C.

FIG. 12A is a schematic side view of a packaged transistor device 600A. As shown in FIG. 12A, packaged transistor device 600A includes the semiconductor device 300A packaged in an open cavity package 610A. The package 610A includes metal gate leads 622A, metal drain leads 624A, a metal submount 630, sidewalls 640 and a lid 642.

The submount 630 may include materials configured to assist with the thermal management of the packaged transistor device 600A. For example, the submount 630 may include copper and/or molybdenum. In some embodiments, the submount 630 may be composed of multiple layers and/or contain vias/interconnects. In an example embodiment, the submount 630 may be a multilayer copper/molybdenum/copper metal flange that comprises a core molybdenum layer with copper cladding layers on either major surface thereof. In some embodiments, the submount 630 may include a metal heat sink that is part of a lead frame or metal slug. The sidewalls 640 and/or lid 642 may be formed of or include an insulating material in some embodiments. For example, the sidewalls 640 and/or lid 642 may be formed of or include ceramic materials. In some embodiments, the sidewalls 640 and/or lid 642 may be formed of, for example, $Al_2O_3$. The lid 642 may be glued to the sidewalls 640 using an epoxy glue. The sidewalls 640 may be attached to the submount 630 via, for example, brazing. The gate lead 622A and the drain lead 624A may be configured to extend through the sidewalls 640, though embodiments of the present invention are not limited thereto.

The semiconductor device 300A is mounted on the upper surface of the metal submount 630 in an air-filled cavity 612 defined by the metal submount 630, the ceramic sidewalls 640 and the ceramic lid 642. Gate and drain terminals 632, 634 of the semiconductor device 300 may be on the top side of the semiconductor device 300A, while a source terminal 636 may be on the bottom side of the semiconductor device 300A. The source terminal 636 may be mounted on the metal submount 630 using, for example, a conductive die attach material (not shown). The metal submount 630 may provide the electrical connection to the source terminal 636 and may also serve as a heat dissipation structure that dissipates heat that is generated in the semiconductor device 300A. The heat is primarily generated in the upper portion of the semiconductor device 300A where relatively high current densities are generated in, for example, the channel regions of the unit cell transistors. This heat may be transferred though the semiconductor structure 390 to the source terminal 636 and then to the metal submount 630.

Input matching circuits 650 and/or output matching circuits 652 may also be mounted within the package 610A. The matching circuits 650, 652 may include impedance matching and/or harmonic termination circuits. The impedance matching circuits may be used to match the impedance of the fundamental component of RF signals that are input to or output from the packaged transistor device 600A to the impedance at the input or output of the semiconductor device 300A, respectively. The harmonic termination circuits may be used to ground harmonics of the fundamental RF signal that may be present at the input or output of the semiconductor device 300A. More than one input matching circuit 650 and/or output matching circuit 652 may be provided. As schematically shown in FIG. 12A, the input and output matching circuits 650, 652 may be mounted on the metal submount 630. The gate lead 622A may be connected to the input matching circuit 650 by one or more bond wires 654, and the input matching circuit 650 may be connected to the gate terminal 632 of semiconductor device 300A by one or more additional bond wires 654. Similarly, the drain lead 624A may be connected to the output matching circuit 652 by one or more bond wires 654, and the output matching circuit 652 may be connected to the drain terminal 634 of semiconductor device 300A by one or more additional bond wires 654. The bond wires 654, which are inductive elements, may form part of the input and/or output matching circuits 650, 652.

FIG. 12B is a schematic side view of a packaged transistor device 600B that includes the semiconductor device 300A of FIG. 7A packaged in a printed circuit board-based package 610B. The packaged transistor device 600B is very similar to the packaged transistor device 600A of FIG. 12A, except that the gate and drain leads 622A, 624A of package 610A are replaced with printed circuit board-based leads 622B, 624B in package 610B.

The package 610B includes a submount 630, ceramic sidewalls 640, a ceramic lid 642, each of which may be substantially identical to the like numbered elements of package 610A discussed above. The package 610B further includes a printed circuit board 620. Conductive traces on the printed circuit board 620 form a metal gate lead 622B and a metal drain lead 624B. The printed circuit board 620 may be attached to the submount 630 via, for example, a conductive glue. The printed circuit board 620 includes a central opening and the semiconductor device 300 is mounted within this opening on the submount 630. Other components of packaged transistor device 600B may be the same as the like-numbered components of packaged transistor device 600A, and hence further description thereof will be omitted.

FIG. 12C is a schematic side view of another packaged transistor device 600C. Packaged transistor device 600C differs from packaged transistor device 600A in that it includes a different package 610C. The package 610C includes a metal submount 630 (which may be similar or identical to the like numbered submount 630 of package 610A), as well as metal gate and drain leads 622C, 624C. Packaged transistor device 600C also includes a plastic overmold 660 that at least partially surrounds the semiconductor device 300A, the leads 622C, 624C, and the metal submount 630. Other components of packaged transistor device 600C may be the same as the like-numbered components of transistor device 600A and hence further description thereof will be omitted.

The various embodiments of the present invention discussed above have depicted the gate contact, the source contact, and the drain contact as all being on the upper surface of the semiconductor structure (i.e., the surface that is opposite the surface that contacts the substrate). Herein, such contacts may be referred to as "top side" contacts. It will be appreciated, however, that the semiconductor devices according to embodiments of the present invention are not limited to only having top side source, gate and drain contacts. For example, as discussed above with reference to FIG. 7A, conductive source vias (not shown) may be provided that extend through the semiconductor structure 390 and the substrate 322. These source vias may comprise, for example, metal plated or metal filled vias (openings) that may be used to electrically connect the top side source contacts 315 to a first backside metal layer that may be provided on the lower surface of the substrate 322. The first backside metal layer may serve as a backside source contact.

In other embodiments, gate vias may be provided that extend through the semiconductor structure 390 and the substrate 322 to electrically connect the top side gate contacts 310 to a second backside metal pattern that may be provided on the lower surface of the substrate 322 that may serve as a backside gate contact, and/or drain vias may be provided that extend through the semiconductor structure 390 and the substrate 322 to electrically connect the drain contacts 305 to a third backside metal pattern that may be provided on the lower surface of the substrate 322 that may serve as a backside drain contact. The use of backside source, gate and/or drain contacts may provide a convenient way to connect the semiconductor device to outside circuits, and may, for example, reduce or eliminate any need for bond wire connections between the semiconductor device and outside circuits.

It will be appreciated that the semiconductor devices according to embodiments of the present invention may include any combination of backside source, drain and gate contacts (and their associated vias). For example, in some embodiments, backside source and gate contacts (and their associated vias) may be provided, while in other embodiments backside source and drain contacts (and their associated vias) may be provided. In still other embodiments, backside source, gate and drain contacts (and their associated vias) may be provided. Other combinations are possible. It will also be appreciated that the top side source, gate and drain contacts 305, 310, 315 may or may not be connected to (or comprise) bond pads or other structures facilitating making electrical connections from external sources to the top side source, gate and drain contacts 305, 310, 315. Thus, the semiconductor devices according to embodiments of the present invention can be configured to have top side only, backside only or both topside and backside contact structures for connecting to external circuits for each of the source, gate and drain contacts.

U.S. patent application Ser. No. 17/211,281, filed Mar. 24, 2021 ("the '281 application"), discloses RF transistor amplifiers that have backside source, gate and/or drain contacts. The entire content of the '281 application is incorporated herein by reference. It will be appreciated that any of the arrangements of backside and top side source, gate and drain contacts that are disclosed in the '281 application may be used in any of the semiconductor devices according to embodiments of the present invention disclosed herein. It will also be appreciated that the semiconductor devices according to embodiments of the present invention may be mounted so that the substrate is mounted on an underlying mounting substrate, or alternatively may be mounted in a flip-chip configuration where the top side contacts are mounted on the underlying mounting substrate.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, unless otherwise specified, "approximately" and/or "substantially" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, N type material has a majority equilibrium concentration of negatively charged electrons, while P type material has a majority equilibrium concentration of positively charged holes. Some material may be designated with a "+" or "−" (as in N+, N−, P+, P−, N++, N--, P++, P--, or the like), to indicate a relatively larger ("+") or smaller ("-") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A semiconductor device comprising:
   a substrate, wherein an upper surface of the substrate comprises a recess region;
   a semiconductor structure on the substrate, a portion of the semiconductor structure within the recess region; and
   a gate contact, a drain contact, and a source contact on the semiconductor structure,
   wherein the recess region is in between the gate contact and the source contact and does not vertically overlap the drain contact,
   wherein the semiconductor device comprises a high electron mobility transistor (HEMT) and the semiconductor structure comprises a channel layer and a barrier layer on the channel layer, and the channel layer extends continuously from underneath the source contact to underneath the drain contact,
   wherein the portion of the semiconductor structure that is within the recess region is an undoped Group III-nitride layer, and
   wherein the substrate comprises an n-type semiconductor substrate that includes a p-type impurity region adjacent the recess region.

2. The semiconductor device of claim 1, wherein the p-type impurity region does not vertically overlap the drain contact.

3. The semiconductor device of claim 2, wherein the p-type impurity region is on at least one sidewall and/or a bottom surface of the recess region.

4. The semiconductor device of claim 1, wherein the recess region vertically overlaps a portion of the semiconductor structure that is in between the source contact and the gate contact.

5. The semiconductor device of claim 1, wherein the upper surface of the substrate comprises silicon carbide.

6. The semiconductor device of claim 1, wherein the recess region does not vertically overlap the gate contact or the source contact.

7. The semiconductor device of claim 1, wherein the p-type impurity region only vertically overlaps a portion of the source contact.

8. The semiconductor device of claim 1, wherein the p-type impurity region only vertically overlaps a portion of the gate contact.

9. A semiconductor device comprising:
   a substrate, wherein an upper surface of the substrate comprises a recess region;
   a semiconductor structure on the substrate, a portion of the semiconductor structure within the recess region; and
   a gate contact, a drain contact, and a source contact on the semiconductor structure,
   wherein the substrate and the portion of the semiconductor structure within the recess region form a heterojunction,
   wherein the semiconductor device is configured so that a two-dimensional electron gas ("2DEG") layer that extends continuously from underneath the source contact to underneath the drain contact is induced in the semiconductor structure during on-state operation,
   wherein the recess region does not vertically overlap any of the source contact, the gate contact or the drain contact
   wherein portions of the substrate that comprise sidewalls of the recess region and a bottom of the recess region are implanted with first conductivity type dopants.

10. The semiconductor device of claim 9, wherein the portion of the semiconductor structure that is within the recess region is an undoped Group III-nitride layer.

11. The semiconductor device of claim 9, wherein the substrate comprises an n-type semiconductor substrate.

12. The semiconductor device of claim 9, wherein the portions of the substrate that comprise the sidewalls of the recess region and the bottom of the recess region that are implanted with the first conductivity type dopants only vertically overlaps a portion of the source contact.

13. The semiconductor device of claim 9, wherein the portions of the substrate that comprise the sidewalls of the recess region and the bottom of the recess region that are implanted with the first conductivity type dopants only vertically overlaps a portion of the gate contact.

* * * * *

UNITED STATES PATENT AND TRADEMARK OFFICE
CERTIFICATE OF CORRECTION

PATENT NO. : 12,218,202 B2  
APPLICATION NO. : 17/477004  
DATED : February 4, 2025  
INVENTOR(S) : Jones et al.

Page 1 of 1

It is certified that error appears in the above-identified patent and that said Letters Patent is hereby corrected as shown below:

In the Specification

Column 20, Line 43: Please correct "42Q" to read --420--

Column 22, Line 2: Please correct "HYPE" to read --HVPE--

Signed and Sealed this  
Fifteenth Day of July, 2025

Coke Morgan Stewart  
*Acting Director of the United States Patent and Trademark Office*